（12）United States Patent
Chang et al.

(10) Patent No.: US 12,374,600 B2
(45) Date of Patent: Jul. 29, 2025

(54) DAM STRUCTURE ON LID TO CONSTRAIN A THERMAL INTERFACE MATERIAL IN A SEMICONDUCTOR DEVICE PACKAGE STRUCTURE AND METHODS FOR FORMING THE SAME

(71) Applicant: Taiwan Semiconductor Manufacturing Company Limited, Hsinchu (TW)

(72) Inventors: Wei Teng Chang, Hsinchu (TW); Meng-Tsung Kuo, Tainan (TW); Chih-Kung Huang, Hsinchu (TW); Hui-Chang Yu, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 647 days.

(21) Appl. No.: 17/693,520

(22) Filed: Mar. 14, 2022

(65) Prior Publication Data
US 2023/0022643 A1     Jan. 26, 2023

Related U.S. Application Data

(60) Provisional application No. 63/223,034, filed on Jul. 18, 2021.

(51) Int. Cl.
*H01L 23/433*     (2006.01)
*H01L 21/48*     (2006.01)
(Continued)

(52) U.S. Cl.
CPC ........ *H01L 23/433* (2013.01); *H01L 21/4817* (2013.01); *H01L 25/0655* (2013.01);
(Continued)

(58) Field of Classification Search
CPC ............... H01L 23/433; H01L 25/0655; H01L 25/0652; H01L 21/4817; H01L 2924/16152; H01L 2924/16195
See application file for complete search history.

(56) References Cited

U.S. PATENT DOCUMENTS 11,387,161 B2 *   7/2022   Eid ..................... H01L 23/367
11,784,061 B2 *   10/2023   Lin ......................... H01L 24/83
                                                     257/712
(Continued)

*Primary Examiner* — Alonzo Chambliss
(74) *Attorney, Agent, or Firm* — The Marbury Law Group, PLLC

(57) ABSTRACT

A disclosed semiconductor device includes a package substrate, a first semiconductor die coupled to the package substrate, a package lid attached to the package substrate and covering the semiconductor die, and a thermal interface material located between a top surface of the semiconductor die and an internal surface of the package lid. The semiconductor device may further include a dam formed on the internal surface of the package lid. The dam may constrain the thermal interface material on one or more sides of the first semiconductor die such that the thermal interface material is located within a predetermined volume between the top surface of the first semiconductor die and the internal surface of the package lid during a reflow operation. The package lid may include a metallic material and the dam may include an epoxy material formed as a single continuous structure or may be formed as several disconnected structures.

20 Claims, 20 Drawing Sheets

(51) Int. Cl.
*H01L 25/065* (2023.01)
*H01L 23/00* (2006.01)

(52) U.S. Cl.
CPC .............. *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/1436* (2013.01); *H01L 2924/16152* (2013.01); *H01L 2924/1616* (2013.01); *H01L 2924/16195* (2013.01); *H01L 2924/16251* (2013.01); *H01L 2924/1632* (2013.01); *H01L 2924/16747* (2013.01)

(56) References Cited

U.S. PATENT DOCUMENTS

| | | | |
|---|---|---|---|
| 12,033,912 B2 * | 7/2024 | Hsieh | H01L 21/4882 |
| 2004/0036183 A1 * | 2/2004 | Im | H01L 23/42 |
| | | | 257/796 |
| 2004/0262766 A1 * | 12/2004 | Houle | H01L 23/04 |
| | | | 257/E23.087 |
| 2020/0388554 A1 * | 12/2020 | Falola | H01L 24/29 |
| 2021/0327782 A1 * | 10/2021 | Han | H01L 23/3675 |
| 2022/0344297 A1 * | 10/2022 | Chee | H01L 24/32 |

* cited by examiner

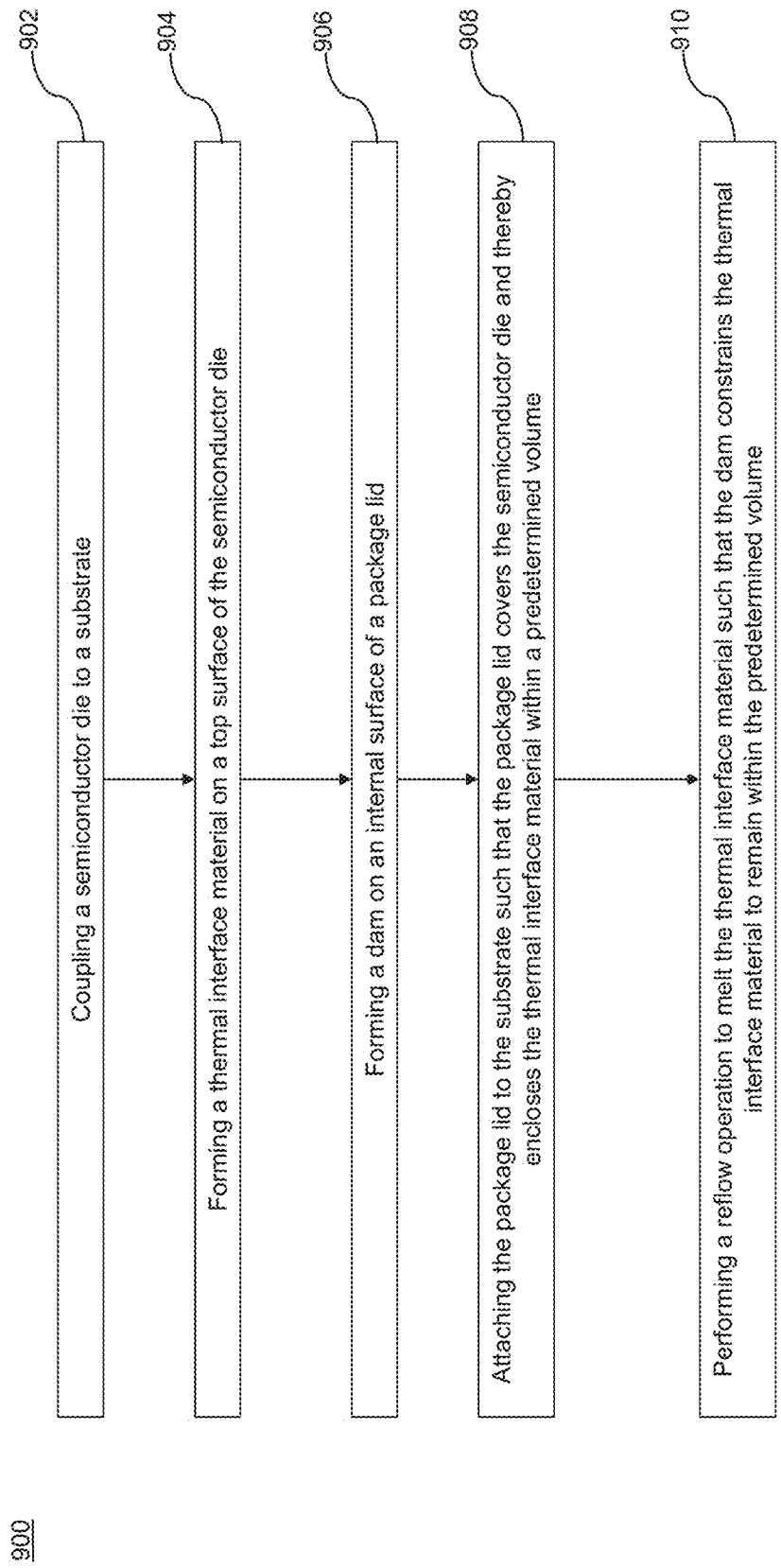

DAM STRUCTURE ON LID TO CONSTRAIN A THERMAL INTERFACE MATERIAL IN A SEMICONDUCTOR DEVICE PACKAGE STRUCTURE AND METHODS FOR FORMING THE SAME

RELATED APPLICATION

This application claims priority to U.S. Provisional Patent Application No. 63/223,034 entitled "Method of Applying Epoxy Dam on a Lid to Constrain Metal Thermal Interface Material (TIM)" filed on Jul. 18, 2021, the entire contents of which are hereby incorporated by reference for all purposes.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers over a semiconductor substrate, and patterning the various material layers using lithography and etch to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

In semiconductor packages, particularly semiconductor packages with relatively higher power utilization, excessive heat generation within the package and poor heat dissipation characteristics may have a number of undesirable effects, including hindered package performance and/or damage to components within the package. There is a continuing need for improvements of semiconductor packages, especially with regard to heat dissipation.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart illustrating operations of a method of fabricating a semiconductor device, according to various embodiments.

DETAILED DESCRIPTION

Figure 1A:
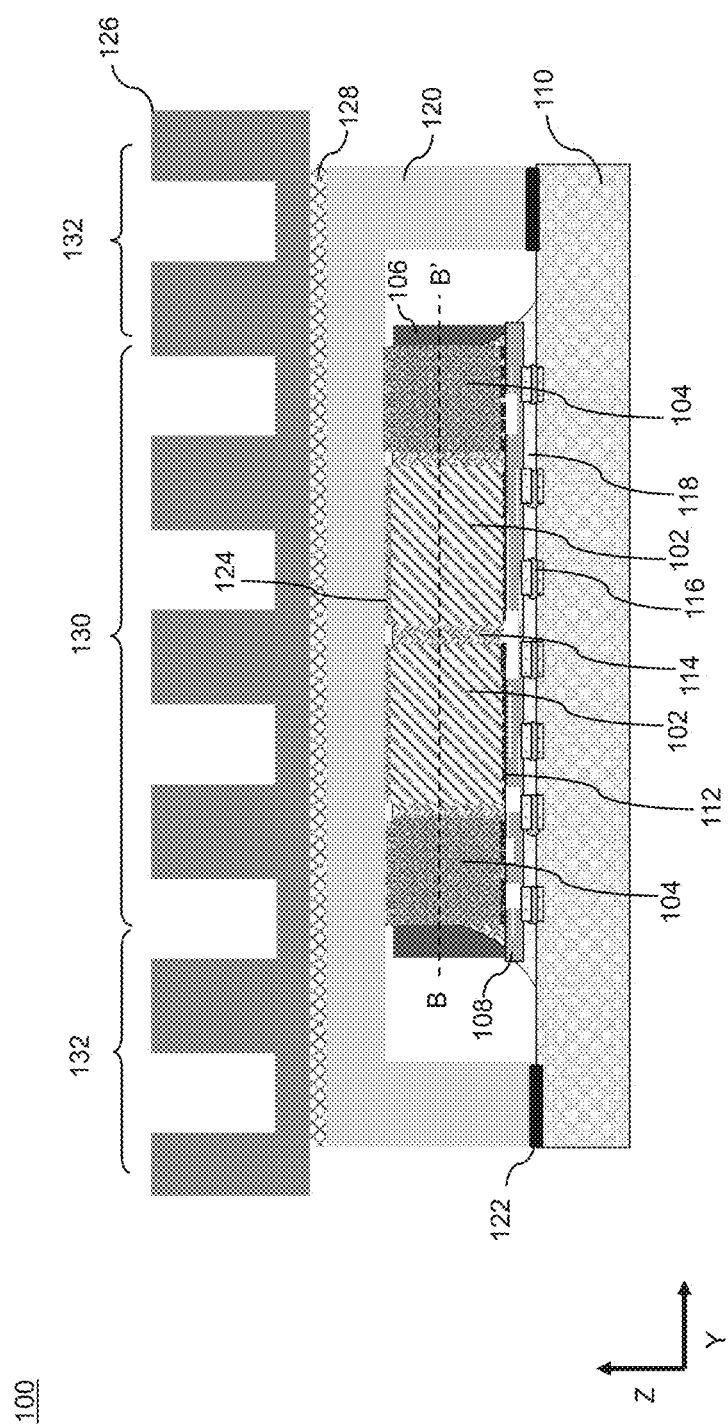
FIG. 1A is a vertical cross-sectional view of a semiconductor device along line AA' in FIG. 1B, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The semiconductor package typically includes a housing that encloses the IC dies to protect the IC dies from damage. The housing may also provide sufficient heat dissipation from the semiconductor package. In some cases, the semiconductor package may include a package lid including a thermally-conductive material (e.g., a metal or metal alloy, such as copper). The package lid may be located over the IC dies. Heat from the IC dies may be transferred from the upper surfaces of the IC dies into the package lid and may be ultimately dissipated to the environment. The heat may optionally be dissipated through a heat sink that may be attached to or may be integrally formed with the lid.

An issue with existing semiconductor packages utilizing a thermally-conductive package lid is that the heat flow through the package lid may not be uniform, which may result in heat accumulation in regions of the package having relatively higher circuit density and/or higher power utilization. In many cases, the highest circuit density and power utilization may be in a central region of the package. To address the issue of heat accumulation, the package lid may be formed of a material having very high thermal conductivity, such as copper, to thereby improve the spread of heat away from hotter regions of the package. However, such materials tend to be more expensive and may add additional cost to the semiconductor package.

The various disclosed embodiments may provide more uniform heat dissipation from the semiconductor package and reduce the risk of damage to the semiconductor package due to excessive heat accumulation. In this regard, a semiconductor package structure may include a thermal interface material located between a top surface of a semiconductor die and an internal surface of a package lid. The presence of thermal interface material may improve heat conduction between the semiconductor die(s) and the package lid. The disclosed embodiments may include a dam that may be used to constrain the thermal interface material that may otherwise flow away from an area between a top surface of a semiconductor die(s) and an internal surface of a package lid. The dam may be formed from an epoxy material.

The presence of such a dam may be advantageous for certain types of thermal interface material. For example, in instances in which the thermal interface material is a liquid or gel, the dam may prevent the thermal interface material from flowing away from the top surface of the semiconductor die. The dam may also be advantageous for use with certain metallic thermal interface materials. For example, a solder material may be used as a metallic thermal interface material. In this regard, forming the thermal interface material includes forming a layer of solder material in the predetermined volume between the top of the first semiconductor die and the internal surface of the package lid. A reflow operation may then be performed to melt the solder material so that it forms a uniform layer. During the reflow operation, the dam may prevent the molten solder material from flowing away from the top surface of the semiconductor die(s).

A disclosed semiconductor device includes a package substrate, a first semiconductor die coupled to the package substrate, a package lid attached to the package substrate and covering the semiconductor die, and a thermal interface material located between a top surface of the semiconductor die and an internal surface of the package lid. The semiconductor device may further include a dam formed on the internal surface of the package lid. The dam may constrain the thermal interface material on one or more sides of the first semiconductor die such that the thermal interface material may be located within a predetermined volume between the top surface of the first semiconductor die and the internal surface of the package lid during a reflow operation. The package lid may include a metallic material and the dam may include an epoxy material formed as a single continuous structure or as several disconnected structures.

Figure 1B:
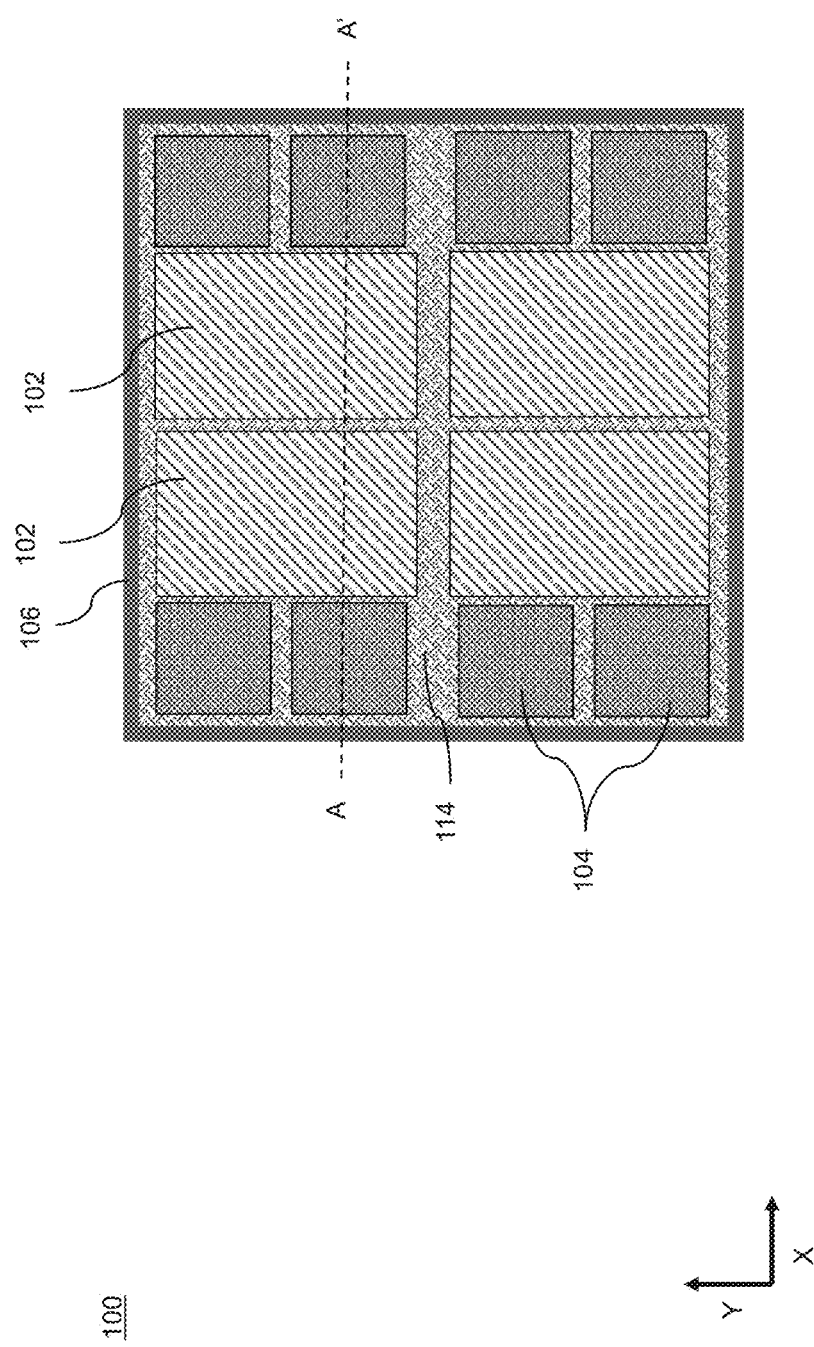
FIG. 1B is a horizontal cross-sectional view of the semiconductor device along line BB' in FIG. 1A, according to various embodiments.

FIG. 1A is a vertical cross-section view of a semiconductor device 100 according to various embodiments. FIG. 1B is a horizontal cross-section view of the semiconductor device 100 taken along line B-B' in FIG. 1A. The view of FIG. 1A is taken along the line A-A' in FIG. 1B. The semiconductor device 100 may include one or more integrated circuit (IC) semiconductor devices. For example, the semiconductor device 100 may include a first plurality of semiconductor dies 102 and a second plurality of semiconductor dies 104. In various embodiments, each semiconductor die 102 may be configured as a three-dimensional device, such as a three-dimensional integrated circuit (3DICs), a system-on-chip (SoC) device, or a system-on-integrated-circuit (SoIC) device.

Each of the semiconductor dies 102 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, one of the semiconductor dies 102 may also be referred to as a "first die stack." In some embodiments, each of the semiconductor dies 102 may be dies or chips, such as logic dies, or power management dies.

In the semiconductor device 100 of FIGS. 1A and 1B, the plurality of semiconductor dies 102 includes four first die stacks, each of which may be configured as a SoC device. In various embodiments, the semiconductor dies 102 may be adjacent to one another and may be located in a central portion of the semiconductor device 100. The semiconductor device 100 may further include one or more additional semiconductor dies 104. In some embodiments, the one or more additional semiconductor dies 104 may be three-dimensional IC semiconductor devices, and may also be referred to as "second die stacks." In some embodiments, the additional semiconductor dies 104 may each be a semiconductor memory device, such as a high bandwidth memory (HBM) device.

In the embodiment shown in FIGS. 1A and 1B, the plurality of additional semiconductor dies 104 includes eight second die stacks, each of which may be an HBM device. The additional semiconductor dies 104 may be located on a periphery around the semiconductor dies 102, as shown in FIG. 1B. A molding 106, which may include an epoxy-based material, may be located around the periphery of the semiconductor dies 102 and the additional semiconductor dies 104. Although the embodiment illustrated in FIGS. 1A and 1B includes four (4) semiconductor dies 102 and eight (8) additional semiconductor dies 104, greater or fewer die stacks may be included in the package.

Referring again to FIG. 1A, the semiconductor dies 102 and the additional semiconductor dies 104 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer are contemplated within the scope of the disclosure. The interposer 108 may include a plurality of conductive bonding pads (not shown) on upper and lower surfaces of the interposer 108 and a plurality of conductive interconnects (not shown) extending through the interposer 108 between the upper and lower bonding pads of the interposer 108.

The conductive interconnects may distribute and route electrical signals between IC semiconductor devices (e.g., semiconductor dies 102 and additional semiconductor dies 104) and a package substrate 110. Thus, the interposer 108 may also be referred to as redistribution layers (RDLs). A plurality of metal bumps 112, such as micro-bumps, may electrically connect conductive bonding pads on the bottom surfaces of the semiconductor dies 102 and additional semiconductor dies 104 to the conductive bonding pads on the upper surface of the interposer 108. In one non-limiting embodiment, metal bumps 112 in the form of micro-bumps may include a plurality of first metal stacks, such as a plurality of Cu—Ni—Cu stacks, located on the bottom surfaces of the semiconductor dies 102 and the additional semiconductor dies 104. A corresponding plurality of second metal stacks (e.g., Cu—Ni—Cu stacks) may be located on the upper surface of the interposer 108. A solder material, such as tin (Sn), may be located between respective first and second metal stacks to electrically connect the semiconductor dies 102 and the additional semiconductor dies 104 to the interposer 108. Other suitable materials for the metal bumps 112 are within the contemplated scope of this disclosure.

A first underfill material portion 114 may be provided in the spaces surrounding the metal bumps 112 and between the bottom surfaces of the semiconductor dies 102, the additional semiconductor dies 104, and the upper surface of the interposer 108. The first underfill material portion 114 may also be provided in the spaces laterally separating adjacent die stacks (i.e., semiconductor dies 102 and additional semiconductor dies 104) of the semiconductor device 100. Thus, the first underfill material portion 114 may extend over side surfaces of the semiconductor dies 102 and/or the additional semiconductor dies 104, as shown in FIG. 1A. In various embodiments, the first underfill material portion 114 may include an epoxy-based material, which may include a composite of resin and filler materials. Other underfill materials are within the contemplated scope of this disclosure.

The interposer 108 may be located on a package substrate 110, which may provide mechanical support for the interposer 108 and the IC semiconductor devices (e.g., semiconductor dies 102 and additional semiconductor dies 104) that are mounted thereon. The package substrate 110 may include a suitable material, such as a semiconductor material (e.g., a semiconductor wafer, such as a silicon wafer), a ceramic material, an organic material (e.g., a polymer and/or thermoplastic material), a glass material, combinations thereof, etc. Other suitable substrate materials are within the contemplated scope of this disclosure. In various embodiments, the package substrate 110 may include a plurality of conductive bonding pads in an upper surface of the package substrate 110. A plurality of metal bumps 116, such as C4 solder bumps, may electrically connect conductive bonding pads on the bottom surface of the interposer 108 to the conductive bonding pads on the upper surface of the package substrate 110. In various embodiments, the metal bumps 116 may include a suitable solder material, such as tin (Sn).

A second underfill material portion 118 may be provided in the spaces surrounding the metal bumps 116 and between the bottom surface of the interposer 108 and the upper surface of the package substrate 110. In various embodiments, the second underfill material portion 118 may include an epoxy-based material, which may include a composite of resin and filler materials. The second underfill material portion 118 may be the same material or a different material as the first underfill material portion 114.

A package lid 120 may be disposed over the upper surfaces of the IC semiconductor devices (e.g., the semiconductor dies 102 and the additional semiconductor dies 104). The package lid 120 may also laterally surround the IC semiconductor devices (e.g., the semiconductor dies 102 and the additional semiconductor dies 104) such that the semiconductor dies 102 and the additional semiconductor dies 104 are fully-enclosed by the combination of the package substrate 110 and the package lid 120. The package lid 120 may be attached to an upper surface of the package substrate 110 via an adhesive 122. In various embodiments, the adhesive 122 may be a thermally-conductive adhesive, such as an SW4450 adhesive from Dow Chemical Company. Other suitable adhesive materials are within the contemplated scope of this disclosure. In some embodiments, the package lid 120 may be integrally formed or may include pieces. For example, the package lid 120 may include a ring portion (not shown) surrounding the semiconductor dies 102 and the additional semiconductor dies 104, a cover portion covering the ring portion, the semiconductor dies 102, and the additional semiconductor dies 104, and an adhesive (not shown) connecting the cover portion to the ring portion.

In some embodiments, a thermal interface material layer 124 may be disposed between an upper surface of each of the IC semiconductor devices (e.g., the semiconductor dies 102 and the additional semiconductor dies 104) and an underside of the package lid 120. In various embodiments, the thermal interface material layer 124 may include a gel-type thermal interface material having a relatively high thermal conductivity. Other suitable materials for the thermal interface material layer 124 are within the contemplated scope of this disclosure. In some embodiments, the thermal interface material layer 124 may include a single thermal interface material piece covering both the semiconductor dies 102 and the additional semiconductor dies 104, or two or more thermal interface material pieces corresponding to each of the semiconductor dies 102 and the additional semiconductor dies 104.

In some embodiments, a heat sink 126 may be provided on an upper surface of the package lid 120. The heat sink 126 may include fins or other features that may be configured to increase a surface area between the heat sink 126 and a cooling fluid, such as ambient air. In some embodiments, the heat sink 126 may be a separate component that may be attached to an upper surface of the package lid 120. Alternatively, the heat sink 126 may be integrally formed with the package lid 120. In embodiments in which the heat sink 126 is a separate component from the package lid 120, a second thermal interface material layer 128 may be located between the upper surface of the package lid 120 and a bottom surface of the heat sink 126. In various embodiments, the second thermal interface material layer 128 may include a gel-type thermal interface material having a relatively high thermal conductivity. Other suitable materials for the second thermal interface material layer 128 are within the contemplated scope of this disclosure. The heat sink 126 may include a suitable thermally-conductive material, such as a metal or metal alloy.

In various embodiments, a central region 130 of the semiconductor device 100 may be a region of the semiconductor device 100 that includes a relatively higher density of the one or more integrated circuit (IC) semiconductor devices, such as the semiconductor dies 102 and the additional semiconductor dies 104 shown in FIGS. 1A and 1B. The semiconductor device 100 may include peripheral regions 132. Each of the peripheral regions 132 may be a region of the semiconductor device 100 that has a relatively lower density of integrated circuit (IC) semiconductor devices, including a region that does not include any IC semiconductor devices.

In the embodiment of FIGS. 1A and 1B, excessive heat accumulation in the semiconductor device 100 may be more likely to occur in the central region 130 of the semiconductor device 100 that includes the highest density of IC semiconductor devices (e.g., the semiconductor dies 102 and the additional semiconductor dies 104) than in the peripheral regions 132 of the semiconductor device 100. This may be because the majority of the heat in the semiconductor device 100 is generated by the IC semiconductor devices (e.g., the semiconductor dies 102 and the additional semiconductor dies 104) in the central region 130 of the semiconductor device 100. As such, heat transfer through the package lid 120 may occur primarily along the vertical direction (i.e., the direction of the z-axis in FIG. 1A) rather than spreading horizontally through the semiconductor device 100 (i.e., along the x-axis and y-axis directions in FIGS. 1A and 1B). Thus, the portion of the package lid 120 overlying the IC semiconductor devices (e.g., 102, 104) in the central region 130 of the semiconductor device 100 may be the hottest portion of the package lid 120.

The concentration of heat generating elements and the hottest portion of the package lid 120 being located in the central region may result in overheating and damage to the semiconductor device 100 if the rate of heat loss from the central region 130 of the semiconductor device 100 is not sufficiently high. In practice, this means that the package lid 120 may include a material having a very high thermal conductivity, such as copper, which has a thermal conductivity of about 398 W/m·K. However, such high-thermal conductivity materials are typically relatively expensive, which may increase the costs of the semiconductor device 100.

Figure 2A:
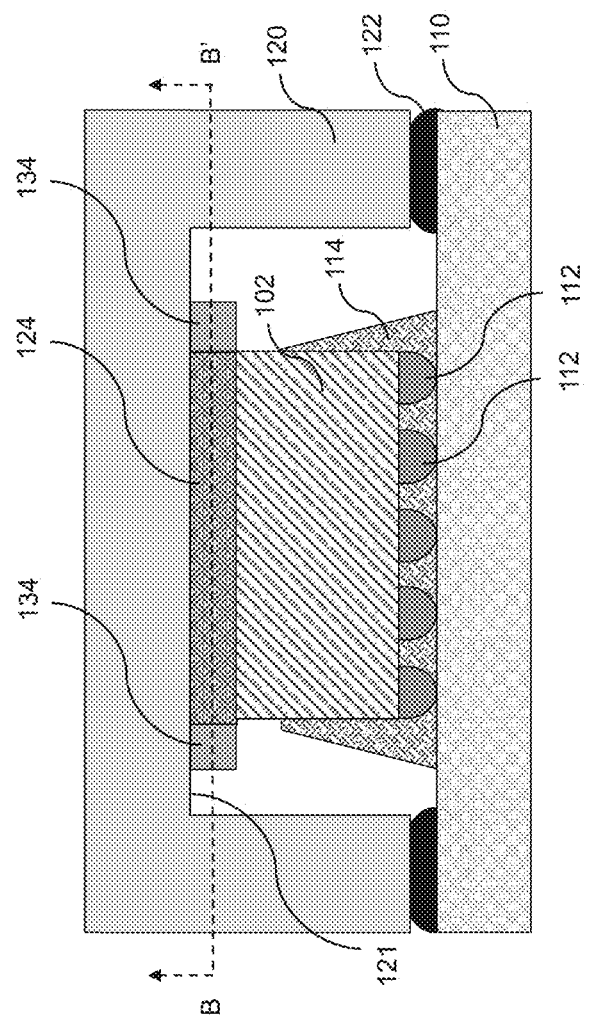
FIG. 2A is a vertical cross-section view of a semiconductor device along line AA' in FIG. 2B, according to various embodiments.

FIG. 2A is a vertical cross-section view of a semiconductor device 200, according to various embodiments. The semiconductor device 200 may be configured as a semiconductor package structure. The semiconductor device 200 may include a package substrate 110, a semiconductor die 102 coupled to the package substrate 110, a package lid 120 attached to the package substrate 110 (with an adhesive 122) and covering the semiconductor die 102, and a thermal interface material layer 124 located between a top surface of the semiconductor die 102 and an internal surface of the package lid 120. The semiconductor device 200 may further include a plurality of metal bumps 112, such as microbumps, which may electrically connect conductive bonding pads (not shown) on a bottom surface of the semiconductor die 102 to conductive bonding pads (not shown) on an upper surface of the package substrate 110. An underfill material portion 114 may be provided in the spaces surrounding the metal bumps 112 and between the bottom surface of the semiconductor die 102 and the top surface of the package substrate 110.

The semiconductor device 200 may further include a dam 134 formed on the internal surface 121 of the package lid 120. The dam 134 may be configured to constrain the thermal interface material layer 124 on one or more sides of the semiconductor die 102 such that the thermal interface material layer 124 may be located within a predetermined volume between the top surface of the semiconductor die 102 and the internal surface 121 of the package lid 120. The presence of such a dam 134 may be advantageous for certain types of thermal interface material layer 124. For example, if the thermal interface material layer 124 is a liquid or gel, the dam 134 may prevent the thermal interface material layer 124 from flowing away from the top surface of the semiconductor die.

The dam 134 may also be advantageous for use with certain metallic thermal interface materials. For example, a solder material may be used as a thermal interface material layer 124. In this regard, forming the thermal interface material layer 124 may include forming a layer of solder material in the predetermined volume between the top of the semiconductor die 102 and the internal surface 121 of the package lid 120. A reflow operation may then be performed to melt the solder material so that the solder material forms a uniform layer. During the reflow operation, the dam 134 may prevent the molten solder material from flowing away from the top surface of the semiconductor die 102. Depending on the geometry of the semiconductor device 200, the dam 134 may be formed on two sides of the semiconductor die 102, as shown in FIG. 2A, or the dam 134 may be formed on greater or fewer sides of the semiconductor die 102, as described in greater detail below.

Figure 2B:
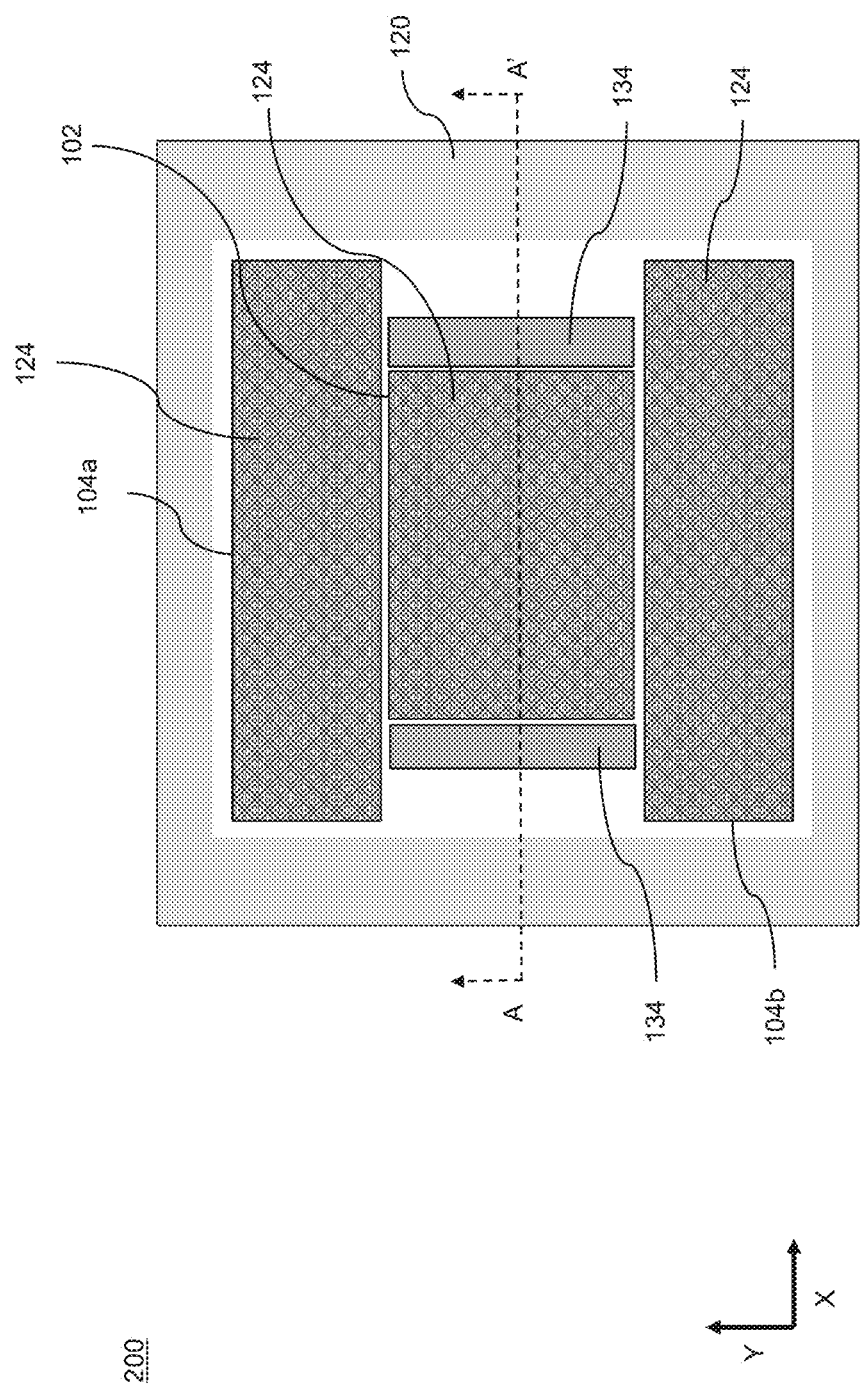
FIG. 2B is a horizontal cross-sectional view of the semiconductor device along line BB' in FIG. 2A, according to various embodiments.

FIG. 2B is a horizontal cross-sectional view of the semiconductor device 200 of FIG. 2A, according to various embodiments. The line B-B' in FIG. 2A illustrates the cross section illustrated in FIG. 2B. In this regard, the cross section B-B' in FIG. 2A cuts through the package lid 120, through the dam 134, and through the thermal interface material layer 124 that may be located between the top surface of the semiconductor die 102 and the internal surface 121 of the package lid. The line A-A' in FIG. 2B illustrates the vertical cross-sectional view of FIG. 2A. While FIG. 2A only shows a single semiconductor die (e.g., semiconductor die 102) as an example, the semiconductor device 200 may further include a second semiconductor die 104a and a third semiconductor die 104b. Each of the second semiconductor die 104a and the third semiconductor die 104b may also include a thermal interface material layer 124, as shown in FIG. 2B.

The thermal interface material layer 124 over the second semiconductor die 104a and the third semiconductor die 104b may be the same as the thermal interface material over the semiconductor die 102. Alternatively, the thermal interface material layer 124 over the second semiconductor die 104a and the third semiconductor die 104b may be different from the thermal interface material layer 124 over the semiconductor die 102. For example, as described above with reference to FIGS. 1A and 1B, the heat dissipation requirements of the central region 130 may be different from the heat dissipation requirements of peripheral regions 132 (e.g., see FIG. 1A). As such, the thermal interface material layer 124 placed over the semiconductor die 102 may be chosen to have different properties from the thermal interface material layer 124 placed over the second semiconductor die 104a and the third semiconductor die 104b. For example, the thermal interface material layer 124 placed over the semiconductor die 102 may have a higher thermal conductivity and/or higher heat capacity than the thermal interface material layer 124 placed over the second semiconductor die 104a and the third semiconductor die 104b.

In the embodiment of FIGS. 2A and 2B, it may be advantageous to configure the dam 134 to be located next to two edges of the semiconductor die 102. For example, the thermal interface material layer 124 placed over the semiconductor die 102 may be a liquid or may be a solder material that may flow when a reflow operation is performed. As shown in FIG. 2A, the dam 134 may have portions respectively placed on the right and left edges of the semiconductor die 102. Similarly, in FIG. 2B, the two portions of the dam 134 may be located on two edges of the semiconductor die 102 illustrated in the top and bottom of FIG. 2B. This configuration of the dam 134 may prevent the thermal interface material layer 124 from flowing away from the semiconductor die 102 along the respective edges.

In the configuration of FIG. 2B, the presence of the additional semiconductor dies 104 may prevent the thermal interface material layer 124 from flowing away from the remaining edges of the semiconductor die 102. Thus, the placement of the various semiconductor dies may dictate the geometry of the dam 134. As described in greater detail with respect to FIGS. 5A to 8B, the dam 134 may be located on one side, two sides, three sides, or on all four sides of a semiconductor die 102. Further, the dam 134 may be configured as a single continuous structure (e.g., see FIGS. 6A to 8B) or the dam 134 may have several separate pieces (e.g., see FIGS. 2A to 5B). In some embodiments, the dame 134 may have a circular shape that encircles the semiconductor die 102

Figure 3A:
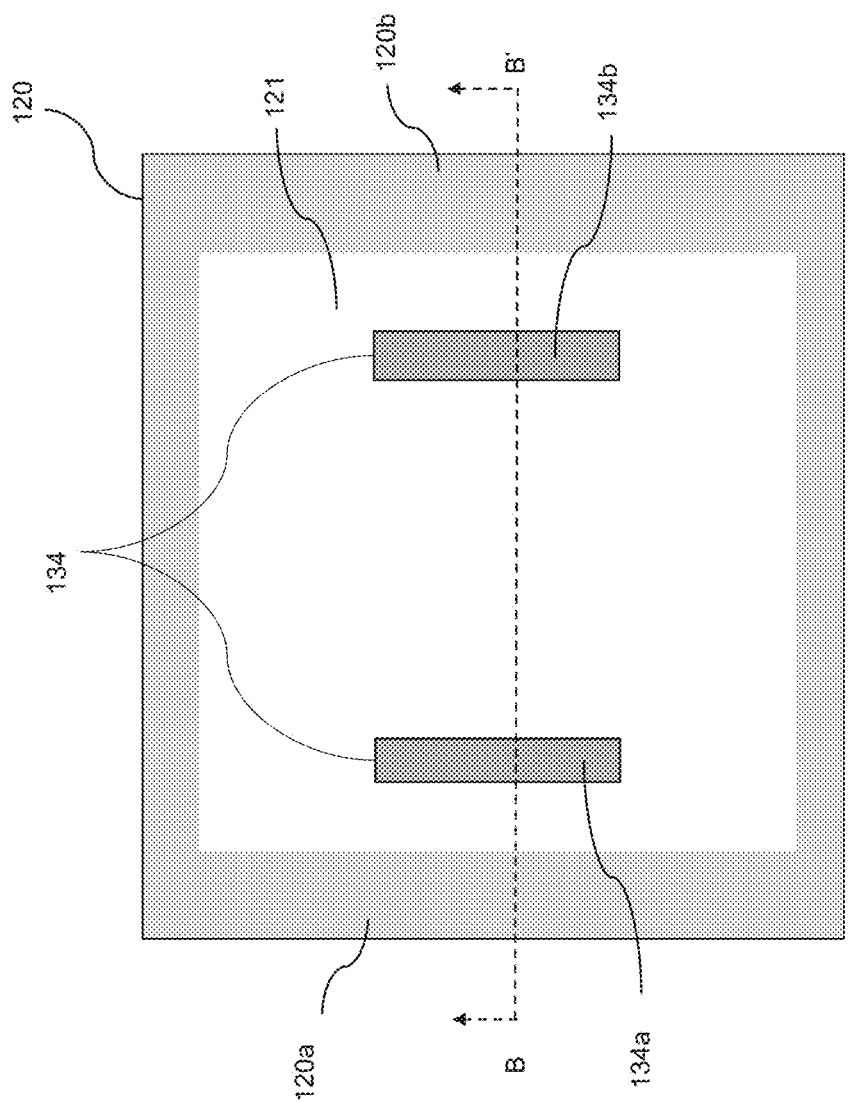
FIG. 3A is a horizontal cross-sectional view of an intermediate structure used in the formation of a semiconductor device along line AA' in FIG. 3B, according to an embodiment.
Figure 3B:
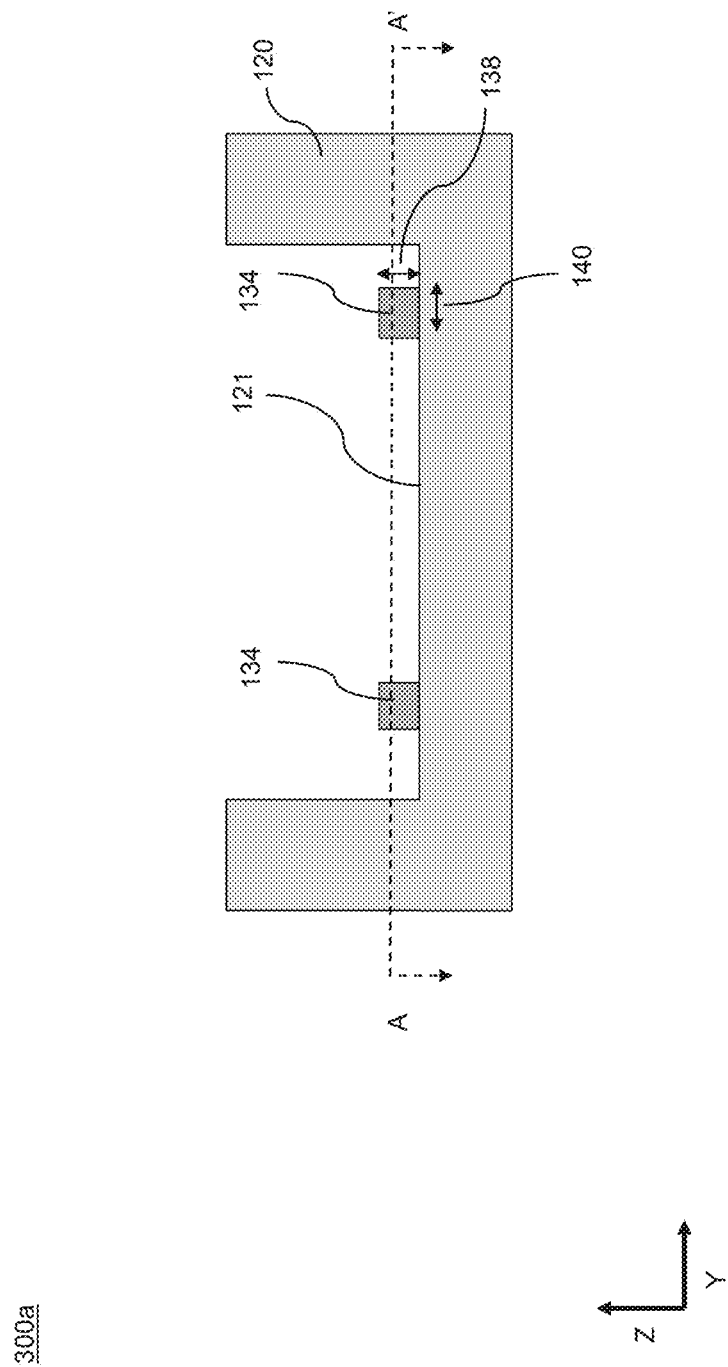
FIG. 3B is a vertical cross-sectional view of the intermediate structure along line BB' in FIG. 3A, according to an embodiment.

FIG. 3A is a horizontal cross-sectional view of an intermediate structure 300a used in the formation of a semiconductor device, and FIG. 3B is a vertical cross-sectional view of the intermediate structure 300a of FIG. 3A, according to an embodiment. As shown in FIGS. 3A and 3B, the intermediate structure 300a includes a package lid 120 having a dam 134 formed on an internal surface 121 thereof. In this regard, FIG. 3A is a top view of the intermediate structure looking downward toward the internal surface 121 of the package lid 120. In this example, the dam 134 may be formed as two separated portions including a first portion 134a and a second portion 134b. As shown in FIG. 3A, for example, each portion of the dam 134 may be extended in a longitudinal direction (e.g., along the Y axis in FIG. 3A) and may have a width along a transverse direction (e.g., along the X axis in FIG. 3A). As shown in FIG. 3B, for example, each portion of the dam 134 may have a height 138 extending along a vertical direction (e.g., along the Z direction in FIG. 3B) and a width 140 extending along a horizontal direction (e.g., along the Y direction in FIG. 3B). Thus, in this example, each portion of the dam 134 has a rectangular geometry. In further embodiments, the dam 134 may have other geometric configurations.

In the above example, the package lid 120 may include a metallic material and the dam 134 may include an epoxy material. It may be advantageous for the package lid 120 to include a material having a relatively high thermal conductivity. For example, the package lid 120 may be made of copper. The dam 134 may be chosen to have a thermal conductivity that is less than or approximately equal to 3 W/m·K.

As shown in FIGS. 3A and 3B, the package lid 120 may have a rectangular geometry and the dam 134 includes a first portion 134a having a first longitudinal dimension that is parallel to a first side 120a of the package lid 120 and a second portion 134b having a second longitudinal dimension that is parallel to a second side 120b of the package lid 120, wherein the second side 120b of the package lid is opposite the first side of the package lid (e.g., see FIG. 3A).

The dam 134 may further have a height 138 (e.g., see FIG. 3B) that is greater than approximately 100 microns and a width 140 (e.g., see FIG. 3B) that is in a range from approximately 300 microns to approximately 1500 microns. Generally, the height of the dam may be the same or substantially the same as the height of the thermal interface material 124. In many embodiments, this height may be the distance between the lid 120 and the semiconductor die 102. In some embodiments, the height 138 of the dam 134 may be greater than the distance between the lid 120 and the semiconductor die 102 to insure that the thermal interface material 124 is fully constrained. In other embodiments, the viscosity of the thermal interface material 124 may be such that the height 138 of the dam 134 may be less than the distance between the lid 120 and the semiconductor die 102.

Figure 3C:
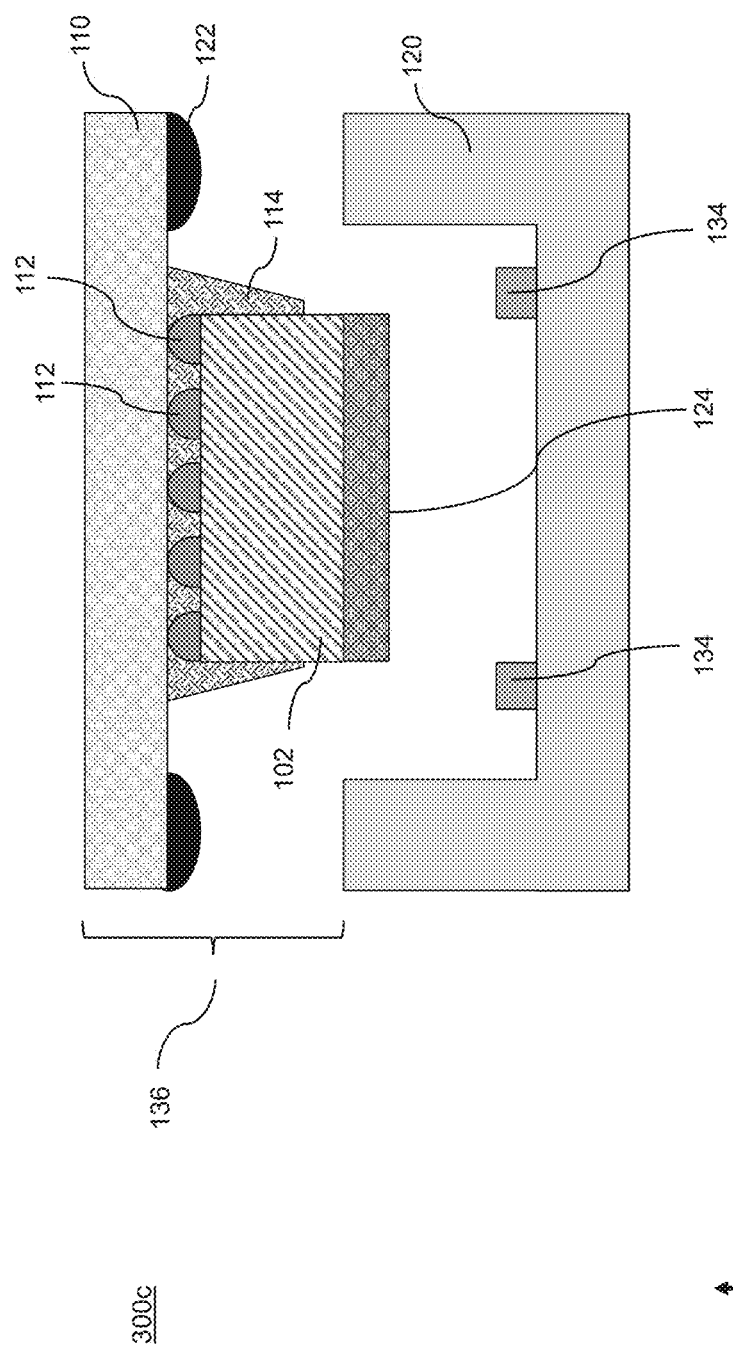
FIG. 3C is a vertical cross-sectional view of a further intermediate structure used in the formation of a semiconductor device, according to an embodiment.

FIG. 3C is a vertical cross-sectional view of a further intermediate structure 300c used in the formation of a semiconductor device, according to an embodiment. As shown, the intermediate structure 300c includes an assembly 136 including a semiconductor die 102 that is coupled to a package substrate 110. A plurality of metal bumps 112, such as micro-bumps, may electrically connect conductive bonding pads (not shown) on the semiconductor die 102 to conductive bonding pads (not shown) on the package substrate 110. An underfill material portion 114 may be provided in the spaces surrounding the metal bumps 112 and between a surface of the semiconductor die 102 and the package substrate 110. As shown in FIG. 3C, the assembly 136 may be configured to be bonded to the package lid 120, in a flip-chip process, using an adhesive 122.

Also, as shown in FIG. 3C, a thermal interface material layer 124 may be placed on a surface of the semiconductor die 102. The thermal interface material 124 may be chosen to have a thermal conductivity that is greater than the thermal conductivity of the dam 134. For example, the thermal interface material layer 124 may have a thermal conductivity that is greater than or approximately equal to 50 W/m·K. Further, the thermal interface material layer 124 may be chosen to be a metallic solder material. In this regard, the thermal interface material layer 124 may have a melting temperature that is less than or approximately equal to 143° C.

Figure 3D:
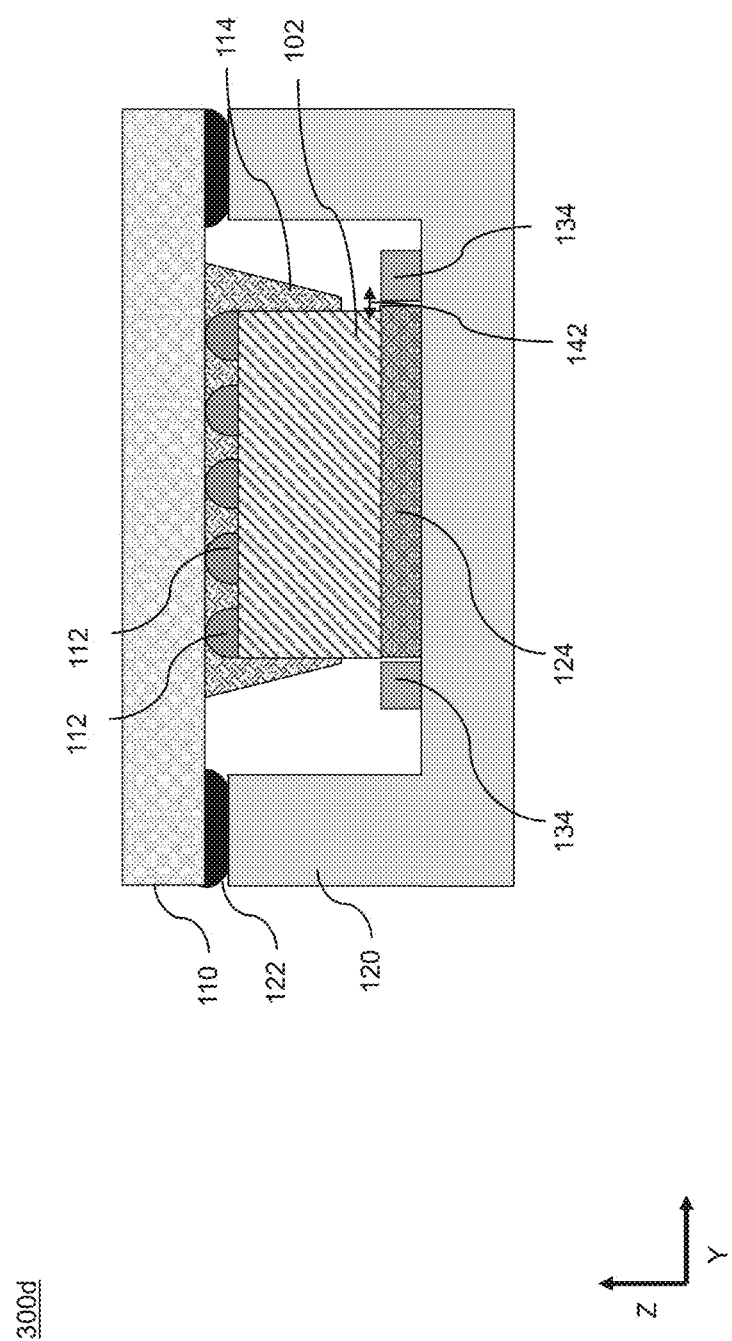
FIG. 3D is a vertical cross-sectional view of a semiconductor device, according to an embodiment.

FIG. 3D is a vertical cross-sectional view of a semiconductor device 300d, according to an embodiment. The semiconductor device 300d may be formed by bonding the assembly 136 to the package lid 120, as shown in FIG. 3C. The semiconductor device 300d may be formed such that there is a gap 142 between an edge of the semiconductor die 102 and an edge of the dam 134. In this regard, an edge of the dam 134 may be separated from an edge of the semiconductor die 102 by a distance (i.e., the gap 142 in FIG. 3D) that is in a range from approximately 0 to approximately 500 mm. Further, the assembly 136 (e.g., see FIG. 3C) may be mounted such that a surface of the semiconductor die 102 is separated from the internal surface of the package lid 120 by a distance that is greater than or approximately equal the height 138 (e.g., see FIG. 3B) of the dam 134, which in this example is greater than or approximately equal to 100 microns.

The semiconductor device 300d may be similar to the semiconductor device 200 that is described above with reference to FIG. 2A. For simplicity of description, the illustrated formation of the semiconductor device 300d only includes a single semiconductor device (e.g., semiconductor die 102) coupled to a package substrate 110, but is not limited thereto. In further embodiments, other semiconductor dies may be included in a semiconductor device, as described above with reference to FIGS. 1A to 2B. For example, a semiconductor device 100 may include a package substrate 110, a system-on-chip die (e.g., semiconductor die 102), and an interposer 108 coupled to the package substrate 110 on a first side of the interposer 108 and coupled to the semiconductor die 102 on a second side of the interposer 108 as shown, for example, in FIGS. 1A and 1B.

The semiconductor device 100 may also include a package lid 120 attached to the package substrate 110 via an adhesive 122. The package lid 120 may cover the interposer 108 and the semiconductor die 102. The semiconductor device 100 may further include a thermal interface material layer 124 located between a top surface of the semiconductor die 102 and an internal surface 121 of the package lid 120 (e.g., see FIG. 2A). As shown in FIGS. 2A to 3D, for example, the semiconductor device (100, 300d) may further include a dam 134 formed on the internal surface 121 of the package lid 120. The dam 134 may be configured to constrain the thermal interface material layer 124 on a first side of the semiconductor die 102 and on a second side of the semiconductor die 102 such that the second side of the system-on-chip die (e.g., semiconductor die 102) is opposite to the first side of the system-on-chip die as shown, for example, in FIGS. 2A and 3D.

As described above, the dam 134 may be configured to constrain the thermal interface material layer 124 such that the thermal interface material layer 124 may be located within a predetermined volume between the top surface of the semiconductor die 102 and the internal surface 121 of the package lid 120, as shown in FIG. 2A. For example, the thermal interface material layer 124 may be a solder material that may be melted in a reflow operation. In this regard, the dam 134 may be configured to constrain the thermal interface material layer 124 during the reflow operation so that the thermal interface material layer 124 does not flow away from a surface of the semiconductor die 102.

As shown in FIG. 2B, for example, the semiconductor device 200 may include various other semiconductor dies. For example, the semiconductor device 200 may further include a first high bandwidth memory die 104a located on a third side of the semiconductor die 102 and a second high bandwidth memory die 104b located on a fourth side of the semiconductor die 102. In an example embodiment, each of the first high bandwidth memory die 104a and the second high bandwidth memory die 104b may each include dynamic random access memory (DRAM) devices. In this example, the first high bandwidth memory die 104a and the second high bandwidth memory die 104b respectively constrain the thermal interface material layer 124 on the third side of the semiconductor die 102 and on the fourth side of the semiconductor die 102.

Figure 3E:
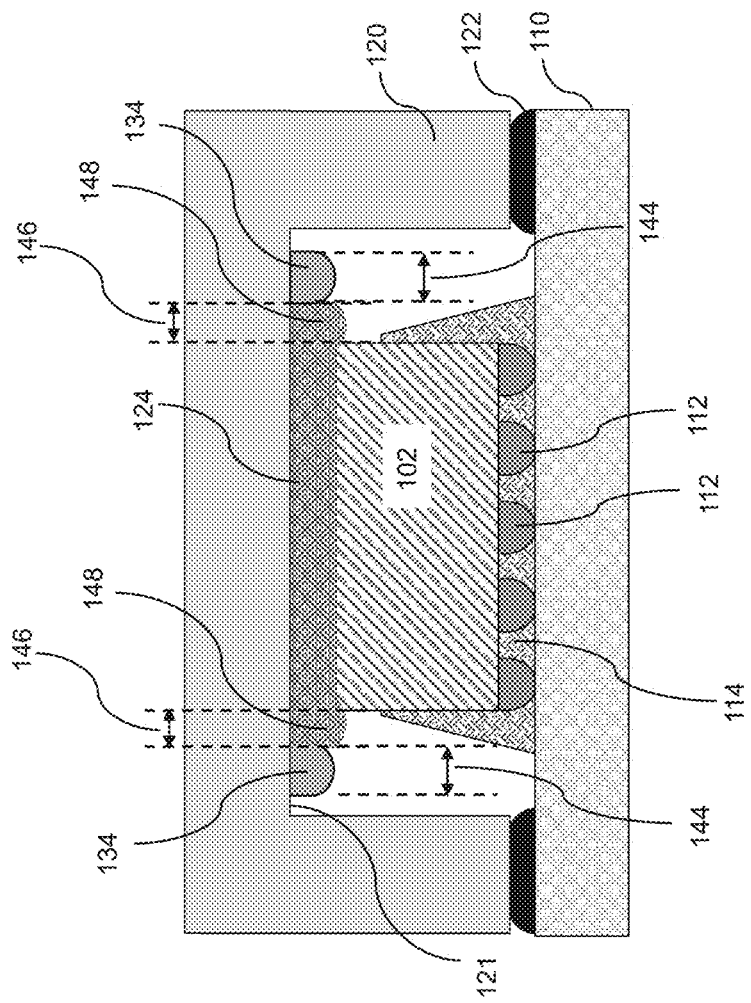
FIG. 3E is a vertical cross-sectional view of a further semiconductor device, according to an embodiment.

FIG. 3E is a vertical cross-section view of a semiconductor device 300e, according to various embodiments. The semiconductor device 300e may be configured as a semiconductor package structure and may be similar to the semiconductor device 200 of FIG. 2A. In this regard, the semiconductor device 300e may include a package substrate 110, a semiconductor die 102 coupled to the package substrate 110, a package lid 120 attached to the package substrate 110 (e.g., with an adhesive 122) and covering the semiconductor die 102, and a thermal interface material layer 124 located between a top surface of the semiconductor die 102 and an internal surface of the package lid 120. The semiconductor device 300e may further include a plurality of metal bumps 112, such as micro-bumps, which may electrically connect conductive bonding pads (not shown) on a bottom surface of the semiconductor die 102 to conductive bonding pads (not shown) on an upper surface of the package substrate 110. An underfill material portion 114 may be provided in the spaces surrounding the metal bumps 112 and between the bottom surface of the semiconductor die 102 and the top surface of the package substrate 110.

The semiconductor device 300e may further include a dam 134 formed on the internal surface 121 of the package lid 120. The dam 134 may be configured to constrain the thermal interface material layer 124 on one or more sides of the semiconductor die 102 such that the thermal interface material layer 124 may be located within a predetermined volume between the top surface of the semiconductor die 102 and the internal surface 121 of the package lid 120. In contrast to the dam 134 of the semiconductor device 200 of FIG. 2A, however, the dam 134 of the semiconductor device 300e may have a different geometrical configuration. For example, the dam 134 of the semiconductor device 300e may have rounded surface shape, in contrast to the rectangular shape of the dam 134 of FIG. 2A.

The dam 134 of FIG. 3E may have a width 144 and may be separated from the semiconductor die 102 by a certain distance 146. The distance 146 may allow a certain portion 148 of the thermal interface material layer 124 to fill a space between the dam 134 and the semiconductor die 102. The presence of the space 146 may be advantageous in that it may relax a constraint for the relative alignment of the package lid 120 and the semiconductor die 102. In this way, the presence of the space 146 may allow for easier assembly of the semiconductor device 300e. The presence of such a dam 134 may be advantageous for certain types of thermal interface material layer 124 that do not need to be as tightly constrained as the materials used in the semiconductor device 200 of FIG. 2A. For example, such space 146 may be used in embodiments in which the viscosity of the thermal interface material layer 124 may fill the space 146 without running out of the space 146. Depending on the geometry of the semiconductor device 300e, the dam 134 may be formed on two sides of the semiconductor die 102, as shown in FIG. 2A, or the dam 134 may be formed on greater or fewer sides of the semiconductor die 102, as described in greater detail below.

Figure 4A:
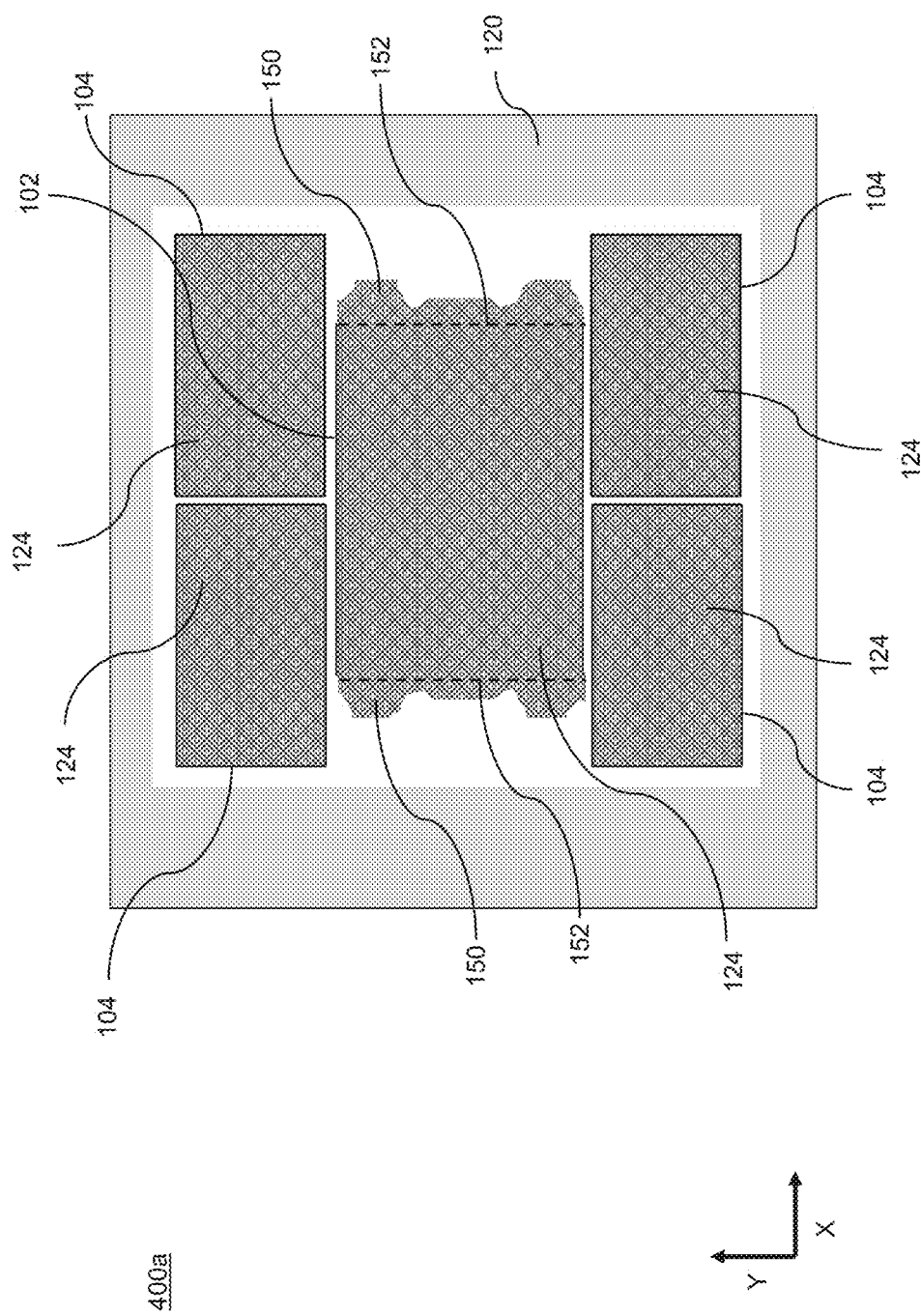
FIG. 4A is a horizontal cross-sectional view of a semiconductor device, according to an embodiment.

FIG. 4A is a horizontal cross-sectional view of a semiconductor device 400a, according to an embodiment. The semiconductor device 400a includes a semiconductor die 102 in a central portion of the semiconductor device 400a and an four additional semiconductor dies 104 (e.g., DRAM devices) surrounding the semiconductor die 102. Each of the semiconductor dies (102, and 104) may include a thermal interface material layer 124. The presence of the additional semiconductor dies 104 may act to constrain the thermal interface material layer 124 on top and bottom sides of the semiconductor die 102. However, the left and right edges 152 of the semiconductor die 102 may be unconstrained. As such, a certain portion 150 of the thermal interface material 124 may leak over the left and right edges 152 of the semiconductor die 102. Such leakage or overflow of the thermal interface material 124 may result in an non-uniform coverage of the thermal interface material 124 over semiconductor die 102. In further embodiments, a dam 134 may be provided to prevent leakage of the thermal interface material 124 over the left and right edges 152 of the semiconductor die 102, as described in greater detail with reference to FIG. 4B, below. The use of he dame 134 may provide a more uniform coverage of the thermal interface material 124 over semiconductor die 102

Figure 4B:
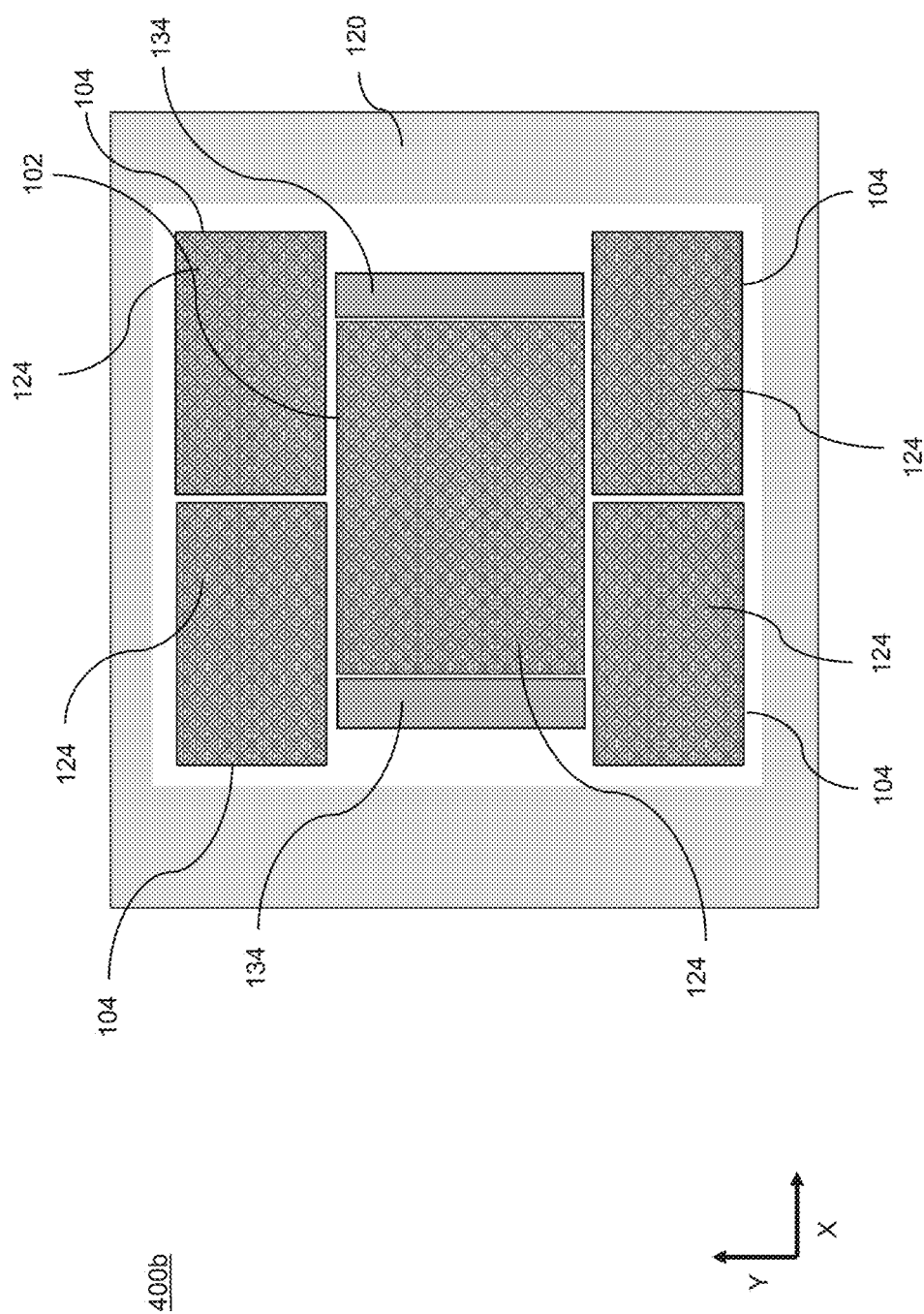
FIG. 4B is a horizontal cross-sectional view of a further semiconductor device, according to an embodiment.

FIG. 4B is a horizontal cross-sectional view of a further semiconductor device 400b, according to an embodiment.

The semiconductor device 400 may be similar to the semiconductor device 200 of FIG. 2B. In this regard, the semiconductor device 400 includes a dam 134 that constrains the thermal interface material layer 124 on first and second sides (e.g., left and right sides) of the semiconductor die 102. The semiconductor device 400 includes four additional semiconductor dies 104 (e.g., DRAM devices) surrounding the semiconductor die 102 that constrain the thermal interface material layer 124 on the third and fourth sides of the semiconductor die 102. As described above, the placement of semiconductor dies (102, 104) may dictate a geometry of the dam 134, as described in greater detail below with reference to FIGS. 5A to 8B.

Figure 5A:
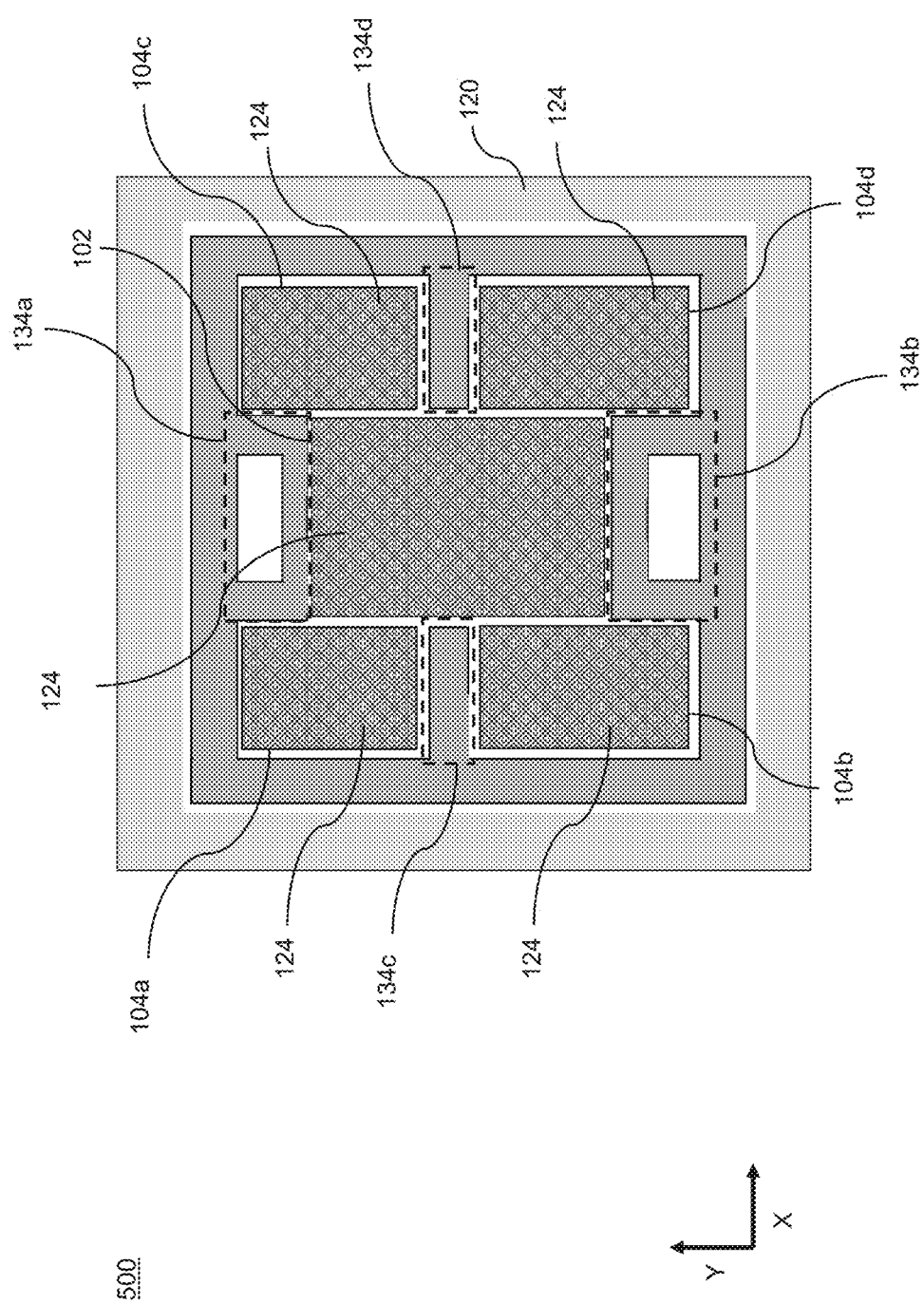
FIG. 5A is a horizontal cross-sectional view of a semiconductor device, according to an embodiment.

FIG. 5A is a horizontal cross-sectional view of a semiconductor device 500, according to an embodiment. The cross-sectional view of FIG. 5A is similar to the horizontal cross-sectional views described above with reference to FIGS. 2B, 3A, and 4. In this regard, the cross-sectional view of FIG. 5A cuts through a package lid 120 and through various thermal interface material layers 124 over respective semiconductor dies. In this example, the semiconductor device 500 includes a semiconductor die 102 and four additional semiconductor dies 104. In an embodiment, the four additional semiconductor dies 104a-104d may include DRAM devices, such as stacked DRAM dies. The semiconductor device 500 is similar to the semiconductor device 400 of FIG. 4. Unlike the semiconductor device 400 of FIG. 4, however, the four semiconductor dies 104 of semiconductor device 500 may not be configured to constrain the thermal interface material layer 124 on the third and fourth sides of the semiconductor die 102 illustrated on the left and right sides of the semiconductor die 102 in FIG. 5A. As such, the dam 134 includes multiple portions that surround the semiconductor die 102.

A first portion 134a and a second portion 134b of the dam 134 constrain the thermal interface material layer 124 on the respective opposite first and second sides of the semiconductor die 102 shown in the top and bottom of FIG. 5A. A third portion 134c and a fourth portion 134d of the dam 134 constrain the thermal interface material layer 124 on respective opposite left and right sides of the semiconductor die 102. In this regard, the third portion 134c of the dam extends into a gap between semiconductor dies 104a and 104b and the fourth portion 134d extends into a gap between semiconductor dies 104c and 104d.

Figure 5B:
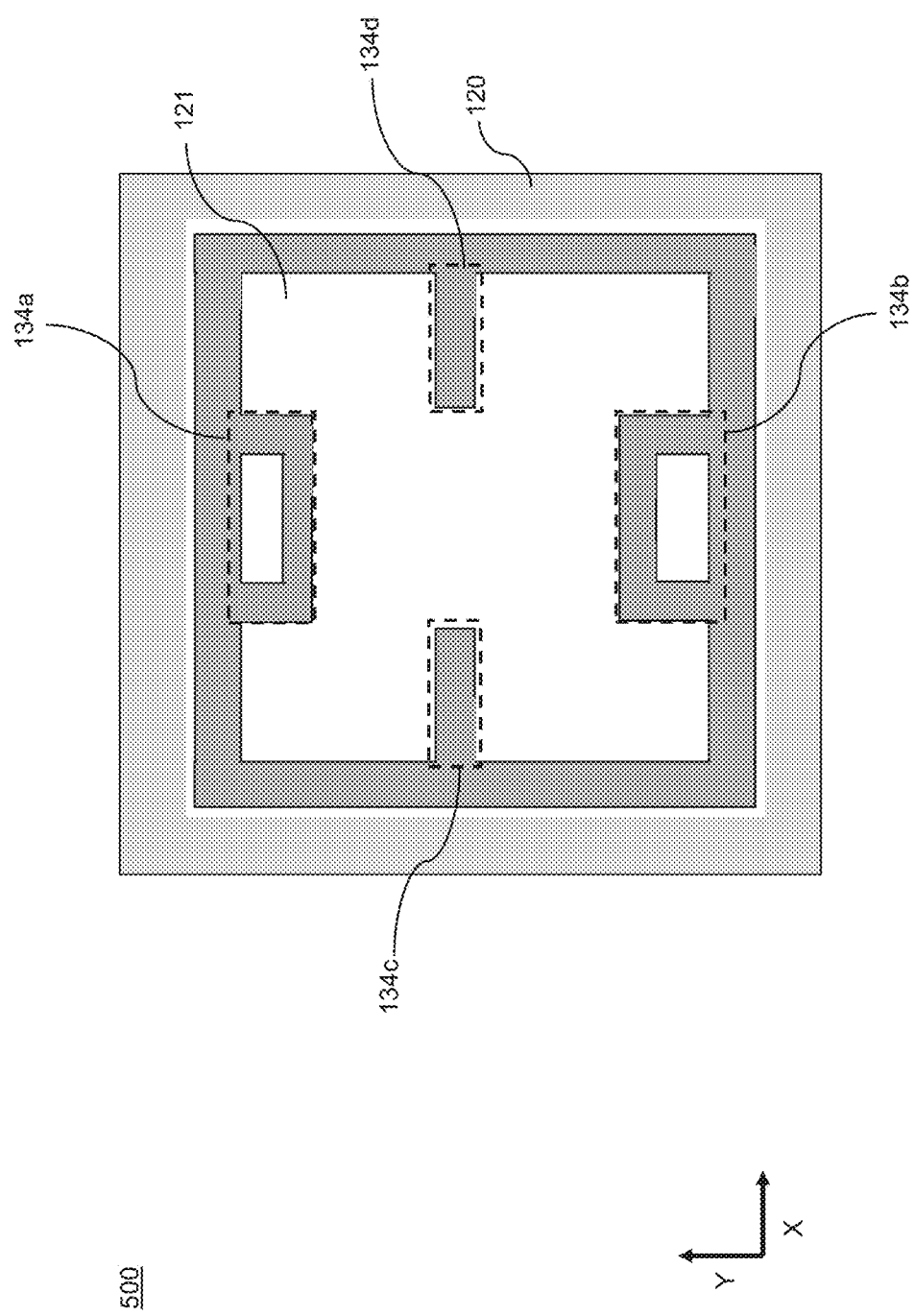
FIG. 5B is a horizontal cross-sectional view of a portion of the semiconductor device of FIG. 5A, according to an embodiment.

FIG. 5B is a horizontal cross-sectional view of a portion of the semiconductor device 500 of FIG. 5A, according to an embodiment. In this regard, the cross-sectional view of FIG. 5B is similar to the cross-sectional view of FIG. 3A that looks downward toward an internal surface 121 of the package lid 120. As shown, the dam 134 may be formed to include the first portion 134a, the second portion 134b, the third portion 134c, and the fourth portion 134d. As described in other embodiments, above, the dam 134 may include an epoxy material. In further embodiments, the dam 134 may include various other materials and may have other geometries. The dam may include a material having a thermal conductivity that is less than or approximately equal to 3 W/m·K. Further, the dam 134 may have a rectangular geometry or may have various other geometries. The package lid 120 may include a metallic material such a copper. Various other embodiments may include package lids 120 including other materials that may have respective thermal conductivities that are suitable to specific devices.

Figure 6A:
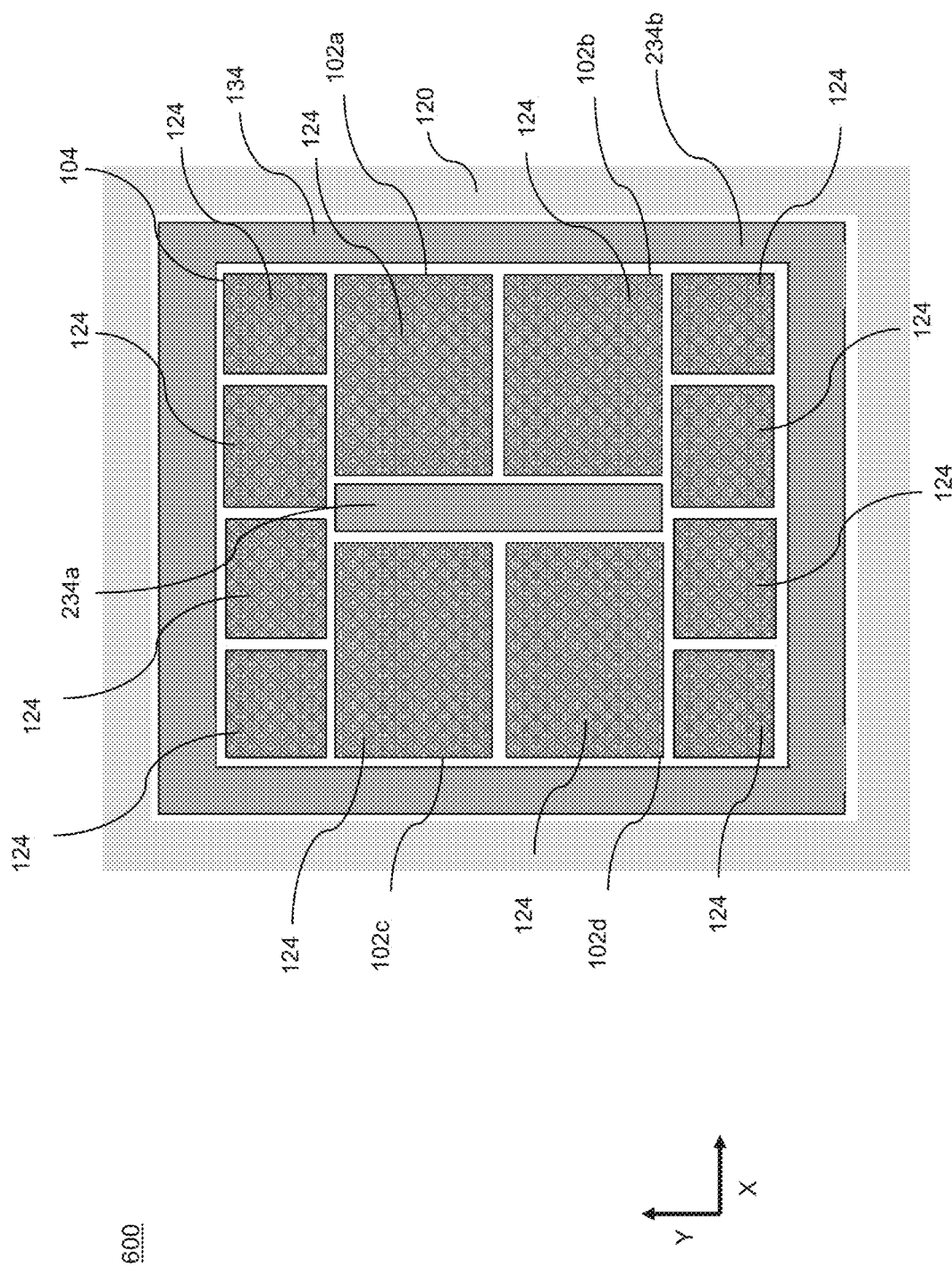
FIG. 6A is a horizontal cross-sectional view of a semiconductor device, according to an embodiment.

FIG. 6A is a horizontal cross-sectional view of a semiconductor device 600, according to an embodiment. The cross-sectional view of FIG. 6A is similar to the horizontal cross-sectional views described above with reference to FIGS. 2B, 3A, 4, and 5A. In this regard, the cross-sectional view of FIG. 6A cuts through a package lid 120 and through various thermal interface material layers 124 over respective semiconductor dies. In this example, the semiconductor device 600 includes a first semiconductor die 102a, a second semiconductor die 102b, a third semiconductor die 102c, and a fourth semiconductor die 102d.

The dam 134 includes a first uniform portion 234a that extends along a longitudinal direction (i.e., along the Y axis in FIG. 6A) and a second uniform portion 234b that surrounds the various semiconductor devices. In this regard, the first portion 234a of the dam 134 may be configured to constrain the thermal interface material layer 124 along a single side of each of the semiconductor die 102a, the second semiconductor die 102b, the third semiconductor die 102c, and the fourth semiconductor die 102d. As described above with respect to other embodiments, the placement of other semiconductor dies (102, 104) may constrain the thermal interface material layer 124 on other sides of the various semiconductor dies. As shown, the second portion 234b may constrain the thermal interface material layer 124 on remaining outer sides of the various semiconductor devices.

Figure 6B:
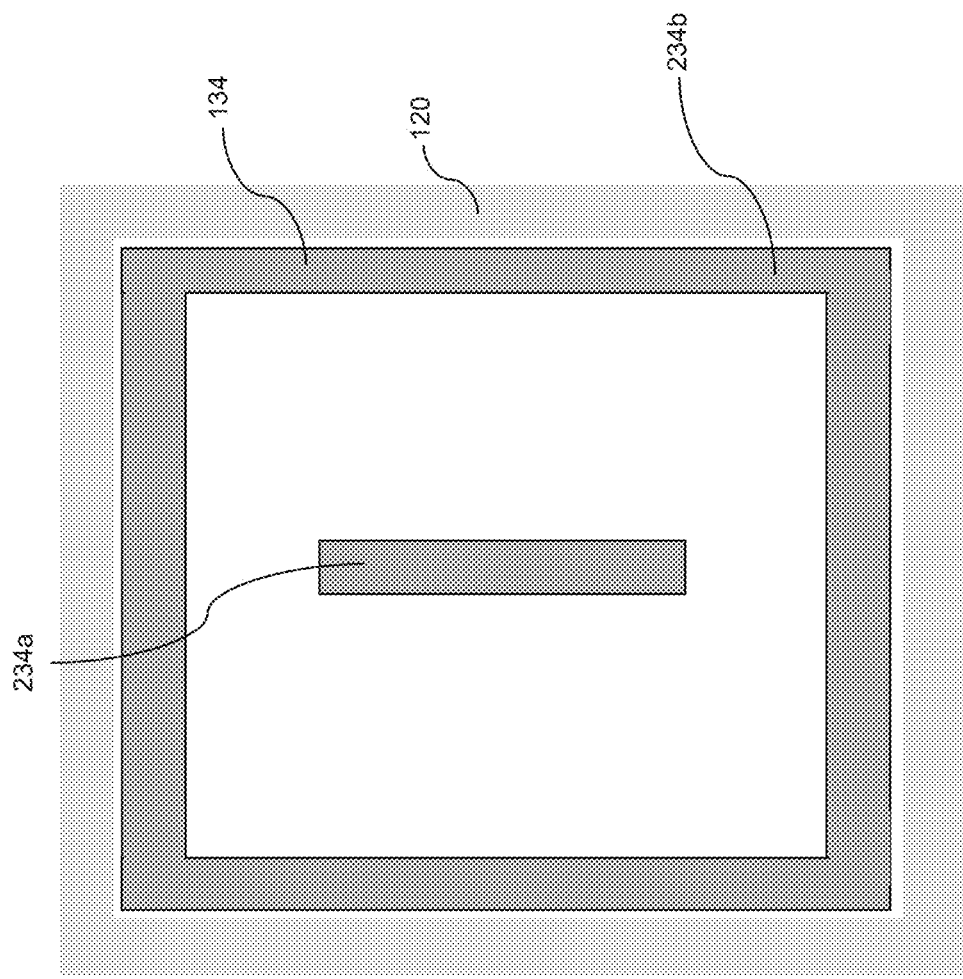
FIG. 6B is a horizontal cross-sectional view of a portion of the semiconductor device of FIG. 6A, according to an embodiment.

FIG. 6B is a horizontal cross-sectional view of a portion of the semiconductor device of FIG. 6A, according to an embodiment. In this regard, the cross-sectional view of FIG. 6B is similar to the cross-sectional views of FIGS. 3A and 5B that look downward toward an internal surface 121 of the package lid 120. As shown, the dam 134 may be formed as separate uniform pieces of epoxy or other material. In this example, the dam 134 includes the first portion 234a and the second portion 234b, as described above. The package lid 120 may be made of a metallic material or other material having suitable thermal conductive properties, as described above.

Figure 7A:
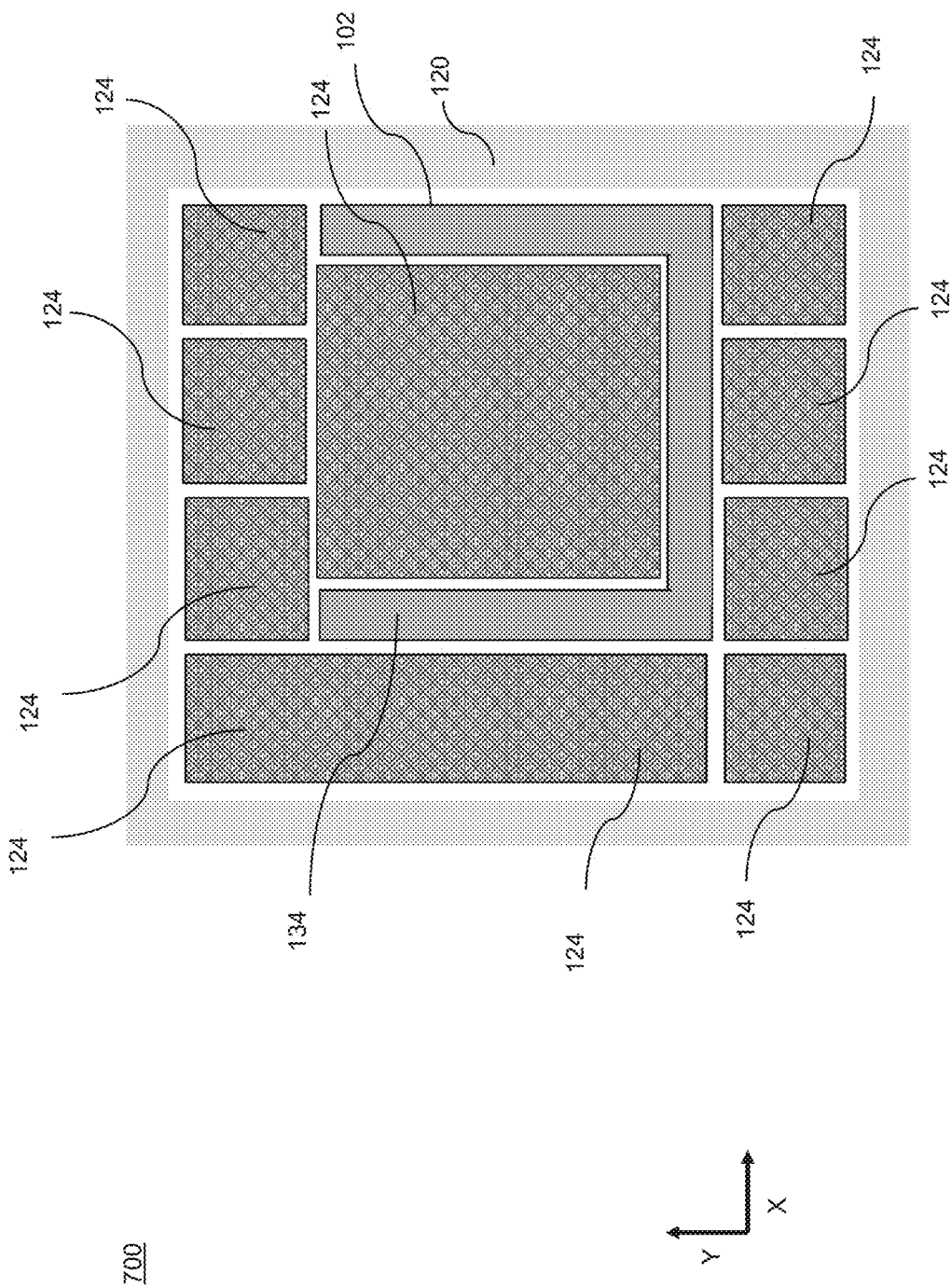
FIG. 7A is a horizontal cross-sectional view of a semiconductor device, according to an embodiment.
Figure 7B:
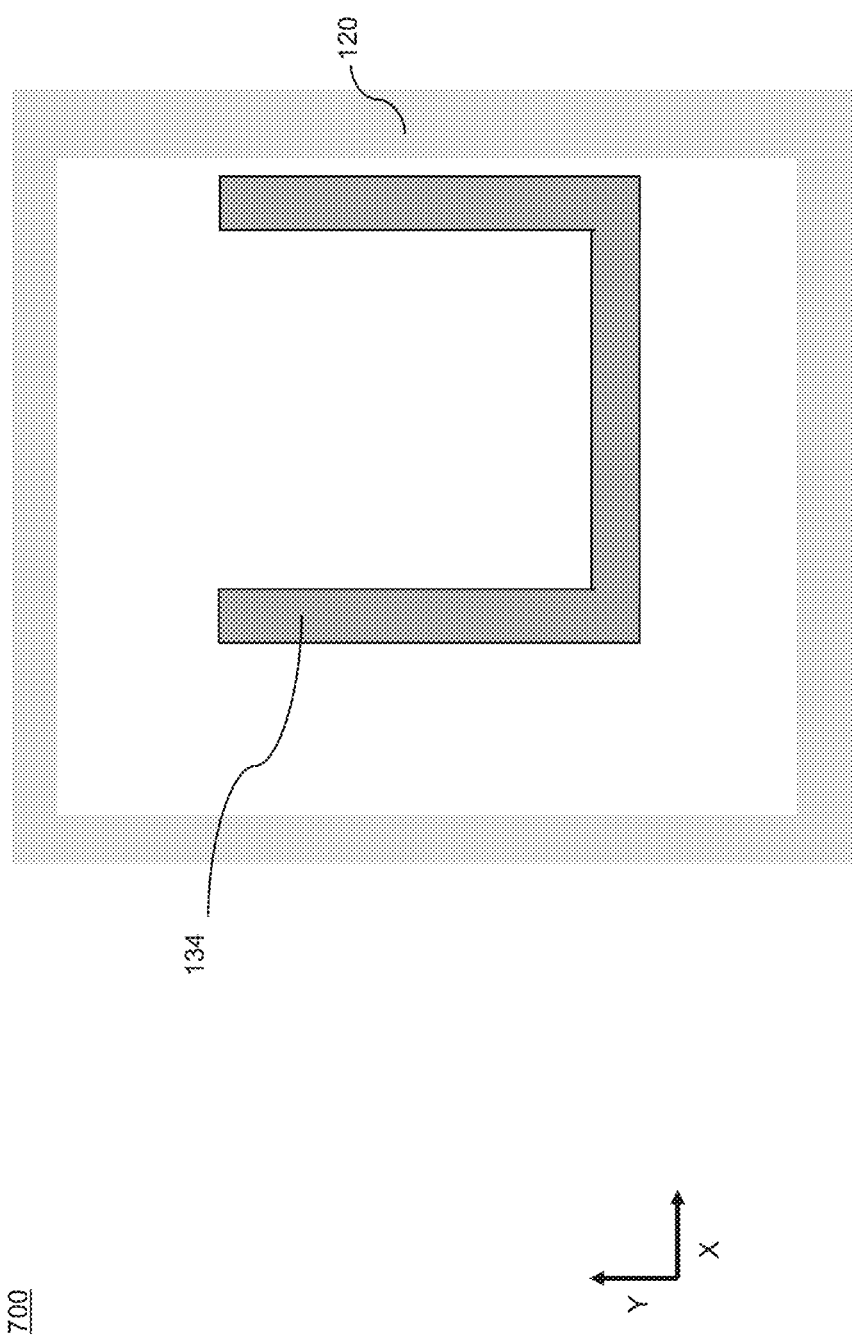
FIG. 7B is a horizontal cross-sectional view of a portion of the semiconductor device of FIG. 7A, according to an embodiment.

FIG. 7A shows a horizontal cross-sectional view of a semiconductor device 700 having a dam 134 that is configured as a single portion that has a U shape in a top view or a bottom view of the package. As such, the dam 134 is configured to constrain the thermal interface material layer 124 on three respective sides of a semiconductor die 102. FIG. 7B shows a horizontal cross-sectional view of a corresponding package lid 120 having the dam 134 formed thereon. In this regard, the cross-sectional view of FIG. 7B is similar to the cross-sectional views of FIGS. 3A, 5B, and 6B that look downward toward an internal surface 121 of the package lid 120. The materials for the dam 134 and package lid 120 may be similar to materials described above for respective structures.

Figure 8A:
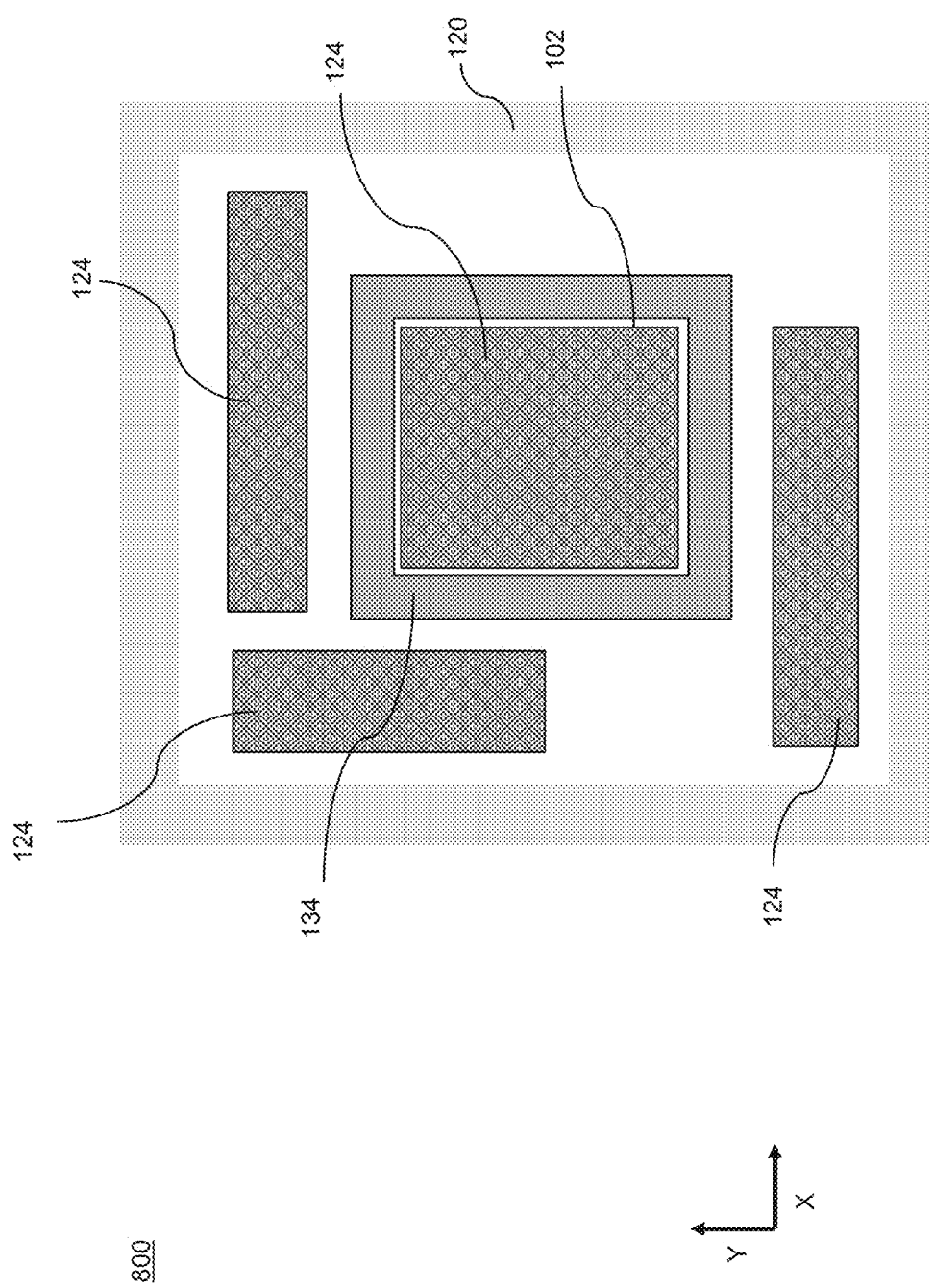
FIG. 8A is a horizontal cross-sectional view of a semiconductor device, according to an embodiment.
Figure 8B:
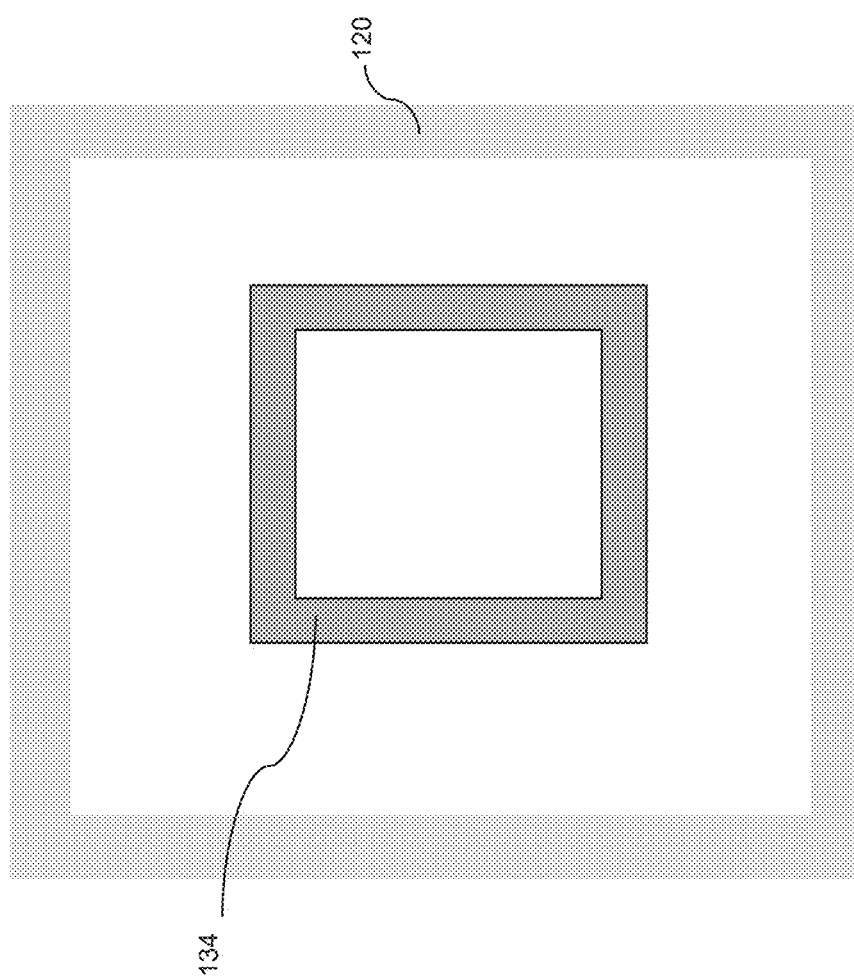
FIG. 8B is a horizontal cross-sectional view of a portion of the semiconductor device of FIG. 8A, according to an embodiment.

FIG. 8A shows a horizontal cross-sectional view of a semiconductor device 800 having a dam 134 that is configured as a single portion that has a rectangular frame shape. As such, the dam 134 is configured to constrain the thermal interface material layer 124 on four respective sides of a semiconductor die 102. FIG. 8B shows a horizontal cross-sectional view of a corresponding package lid 120 having the dam 134 formed thereon. The materials for the dam 134 and package lid 120 may be similar to materials described above for respective structures.

FIG. 9 is a flowchart for a method 900 of fabricating a semiconductor device, according to various embodiments. In operation 902, the method 900 may include coupling a semiconductor die 102 to a package substrate 110, and in operation 904, the method 900 may include forming a thermal interface material layer 124 on a top surface of the semiconductor die 102. In operation 906, the method 900 may include forming a dam 134 on an internal surface 121 of a package lid 120. In operation 908, the method 900 may include attaching the package lid 120 to the package substrate 110 such that the package lid 120 covers the semiconductor die 102 and thereby encloses the thermal interface material layer 124 within a predetermined volume between the top surface of the semiconductor die 102 and the internal surface 121 of the package lid 120.

In operation 910, the method 900 may include performing a reflow operation to melt the thermal interface material layer 124 such that the thermal interface material layer 124 forms a uniform volume of material between the top surface of the semiconductor die (102, 104) and the internal surface 121 of the package lid 120. In this regard, the reflow operation may be performed such that the dam 134 constrains the thermal interface material layer 124 to remain within the predetermined volume between the top surface of the semiconductor die 102 and the internal surface 121 of the package lid 120 during the reflow operation.

The method 900 may further include forming the dam 134 such that the dam 134 includes a height 138 that is greater than approximately 100 microns and a width 140 that is in a range from approximately 300 microns to approximately 1500 microns (e.g., see FIG. 3B). The method 900 may further include forming the dam 134 such that an edge of the dam may be separated from and edge of the semiconductor die 102 by a distance (e.g., gap 142) that is in a range from approximately 0 mm to approximately 500 mm (e.g., see FIG. 3D). The method 900 may further include forming the dam 134 such that the dam 134 includes a first portion (134a, 234a) having a first longitudinal dimension that is parallel to a first side 120a of the package lid 120 and a second portion 134b having a second longitudinal dimension that is parallel to a second side 120b of the package lid 120, such that the second side of the package lid is opposite the first side of the package lid (e.g., see FIG. 3A).

Referring to all drawings and according to various embodiments of this disclosure, a semiconductor device is provided. The semiconductor device (100, 200, 300d, 400, 500, 600, 700, 800) may include a package substrate 110; a semiconductor die 102 coupled to the package substrate 110; a package lid 120 attached to the package substrate 110 and covering the semiconductor die 102; a thermal interface material layer 124 located between a top surface of the semiconductor die 102 and an internal surface 121 of the package lid 120; and a dam 134 formed on the internal surface 121 of the package lid 120. The dam 134 may be configured to constrain the thermal interface material layer 124 on one or more sides of the semiconductor die 102 such that the thermal interface material layer 124 is located within a predetermined volume between the top surface of the semiconductor die 102 and the internal surface 121 of the package lid 120.

In one embodiment, the package lid 120 may include a metallic material and the dam 134 may include an epoxy material. In one embodiment, the dam 134 may include a thermal conductivity that is less than or approximately equal to 3 W/m·K and the thermal interface material layer 124 may include a thermal conductivity greater than or approximately equal to 50 W/m·K. In one embodiment, the thermal interface material layer 124 may include a metallic solder material and/or the thermal interface material layer 124 may include a melting temperature that is less than or approximately equal to 143° C. In one embodiment, the dam 134 may be configured such that an edge of the dam 134 is separated from an edge of the semiconductor die 102 by a distance (e.g., gap 142) that is in a range from approximately 0 to approximately 500 mm. In one embodiment, a top surface of the semiconductor die 102 may be separated from the internal surface 121 of the package lid 120 by a distance that is greater than or approximately equal to 100 microns.

In one embodiment, the package lid 120 may have a rectangular geometry and the dam 134 may have a first portion 134a having a first longitudinal dimension that is parallel to a first side 120a of the package lid 120 and a second portion 134b having a second longitudinal dimension that is parallel to a second side 120b of the package lid 120 such that the second side 120b of the package lid 120 is opposite the first side 120a of the package lid 120 (e.g., see FIG. 3A).

In a further embodiment, a semiconductor device (100, 200) may include a package substrate 110; a system-on-chip die 102; an interposer 108 coupled to the package substrate 110 on a first side of the interposer 108 and coupled to the system-on-chip die 102 on a second side of the interposer 108. The semiconductor device (100, 200) may include a package lid 120 attached to the package substrate 110 and covering the interposer 108 and the system-on-chip die 102; a thermal interface material layer 124 located between a top surface of the system-on-chip die 102 and an internal surface 121 of the package lid 120; and a dam 134 formed on the internal surface 121 of the package lid 120. The dam 134 may be configured to constrain the thermal interface material layer 124 on a first side of the system-on-chip die 102 and on a second side of the system-on-chip die 102 (e.g., see FIG. 2A), such that the second side of the system-on-chip die 102 is opposite to the first side of the semiconductor die 102.

In one embodiment, the dam 134 may be configured to constrain the thermal interface material layer 124 such that the thermal interface material layer 124 is located within a predetermined volume between the top surface of the system-on-chip die 102 and the internal surface 121 of the package lid 120. In one embodiment, the semiconductor device (100, 200, 300d, 400, 500, 600, 700, 800) may further include a first high bandwidth memory die 104a located on a third side of the semiconductor die 102 and a second high bandwidth memory die 104b located on a fourth side of the semiconductor die 102 (e.g., see FIG. 2B). In one embodiment, the first high bandwidth memory die 104a and the second high bandwidth memory die 104b may respectively constrain the thermal interface material layer 124 on the third side of the semiconductor die 102 and on the fourth side of the semiconductor die 102 (e.g., see FIG. 2B).

The disclosed embodiments may have advantages over conventional systems and methods in that a dam 134 may be used to constrain a thermal interface material layer 124 that may otherwise flow away from an area between a top surface of a semiconductor die 102 and an internal surface of a package lid 120. In this way, thermal interface material layers 124 may be constrained withing a predetermined volume between the package lid 120 and the semiconductor die 102 to thereby form a thermally conducting contact between the semiconductor die 102 and the package lid 120.

The use of the dam 134 may therefore allow the use of a thermal interface material layer 124 include a solder material that is melted during a reflow operation. The reflow operation may be used to melt the solder such that the solder forms a uniformly distributed mass of material connecting the semiconductor die 102 to the package lid 120. The use of the dam 134 thus avoids problems that may otherwise be encountered with the use of a solder material as the thermal interface material layer 124. In this regard, the dam 134 may be configured to prevent the solder from flowing away from a surface of the semiconductor die 102 during a reflow operation.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A semiconductor device, comprising:
    a package substrate;
    a semiconductor die coupled to the package substrate and positioned between a first additional semiconductor die and a second additional semiconductor die;
    a package lid attached to the package substrate and covering the semiconductor die;
    a thermal interface material located between a top surface of the semiconductor die and an internal surface of the package lid; and
    a dam formed on the internal surface of the package lid, the dam configured to constrain the thermal interface material on one or more sides of the semiconductor die such that the thermal interface material is located within a predetermined volume between the top surface of the semiconductor die and the internal surface of the package lid,
    wherein a first portion of the dam is positioned adjacent to a first side of the semiconductor die, a second portion of the dam is positioned adjacent to a second side of the semiconductor die, the first additional semiconductor die is positioned adjacent to a third side of the semiconductor die, and the second additional semiconductor die is positioned adjacent to a fourth side of the semiconductor die, such that the predetermined volume of the thermal interface material is between the first additional semiconductor die and the second additional semiconductor die.

2. The semiconductor device of claim 1, wherein the package lid comprises a metallic material and the dam comprises an epoxy material.

3. The semiconductor device of claim 1, wherein the dam comprises a thermal conductivity that is less than or approximately equal to 3 W/m·K and the thermal interface material comprises a thermal conductivity greater than or approximately equal to 50 W/m·K.

4. The semiconductor device of claim 1, wherein the thermal interface material comprises a metallic solder material.

5. The semiconductor device of claim 1, wherein the thermal interface material comprises a melting temperature that is less than or approximately equal to 143° C.

6. The semiconductor device of claim 1, wherein an edge of the dam is separated from an edge of the semiconductor die by a distance that is in a range from approximately 0 to approximately 500 mm.

7. The semiconductor device of claim 1, wherein the top surface of the semiconductor die is separated from the internal surface of the package lid by a distance that is greater than or approximately equal to 100 microns.

8. The semiconductor device of claim 1, wherein the dam comprises a height that is greater than approximately 100 microns and a width that is in a range from approximately 300 microns to approximately 1500 microns.

9. The semiconductor device of claim 1, wherein the package lid comprises a rectangular geometry and the first side of the semiconductor device is opposite the second side of the semiconductor device.

10. A semiconductor device, comprising:
    a package substrate;
    a system-on-chip die positioned between a first additional semiconductor die and a second additional semiconductor die;
    an interposer coupled to the package substrate on a first side of the interposer and coupled to the system-on-chip die on a second side of the interposer;
    a package lid attached to the package substrate and covering the interposer and the system-on-chip die;
    a thermal interface material located between a top surface of the system-on-chip die and an internal surface of the package lid; and
    a dam formed on the internal surface of the package lid, wherein the dam is configured to constrain the thermal interface material on a first side of the system-on-chip die and on a second side of the system-on-chip die,
    wherein the second side of the system-on-chip die is opposite to the first side of the system-on-chip die,
    wherein a first portion of the dam is positioned adjacent to the first side of the system-on-chip die, a second portion of the dam is positioned adjacent to the second side of the system-on-chip die, the first additional semiconductor die is positioned adjacent to a third side of the system-on-chip die, and the second additional semiconductor die is positioned adjacent to a fourth side of the system-on-chip die, such that a predetermined volume of the thermal interface material is between the first additional semiconductor die and the second additional semiconductor die.

11. The semiconductor device of claim 10, wherein the dam is configured to constrain the thermal interface material such that the thermal interface material is located within the predetermined volume between the top surface of the system-on-chip die and the internal surface of the package lid.

12. The semiconductor device of claim 10, wherein the package lid comprises a metallic material and the dam comprises an epoxy material.

13. The semiconductor device of claim 10, wherein the thermal interface material comprises a metallic solder material.

14. The semiconductor device of claim 10, wherein an edge of the dam is separated from an edge of the system-on-chip die by a distance that is in a range from approximately 0 to approximately 500 mm.

15. The semiconductor device of claim 10, wherein the dam comprises a height that is greater than approximately 100 microns and a width that is in a range from approximately 300 microns to approximately 1500 microns.

16. The semiconductor device of claim 10, wherein the package lid comprises a rectangular geometry.

17. The semiconductor device of claim 16, wherein third side of the semiconductor die is opposite the fourth side of the semiconductor die.

18. A semiconductor device, comprising:
a package substrate;
a semiconductor die coupled to the package substrate and positioned between a first additional semiconductor die and a second additional semiconductor die;
an interposer positioned between the semiconductor die and the package substrate, the interposer coupled to the semiconductor die on a first side of the interposer and coupled to the package substrate on a second side of the interposer;
a package lid attached to the package substrate and covering the semiconductor die and the interposer;
a thermal interface material located between a top surface of the semiconductor die and an internal surface of the package lid; and
a dam formed on the internal surface of the package lid, wherein the dam is configured to constrain the thermal interface material on at least two opposite sides of the semiconductor die,
wherein the interposer includes one or more through vias configured to route electrical signals between the semiconductor die and the package substrate,
wherein the thermal interface material is located within a predetermined volume between the top surface of the semiconductor die and the internal surface of the package lid, and
wherein a first portion of the dam is positioned adjacent to a first side of the semiconductor die, a second portion of the dam is positioned adjacent to a second side of the semiconductor die, the first additional semiconductor die is positioned adjacent to a third side of the semiconductor die, and the second additional semiconductor die is positioned adjacent to a fourth side of the semiconductor die, such that the predetermined volume of the thermal interface material is between the first additional semiconductor die and the second additional semiconductor die.

19. The semiconductor device of claim 18, wherein the thermal interface material comprises a melting temperature that is less than or approximately equal to 143° C., and wherein the dam comprises a thermal conductivity that is less than or approximately equal to 3 W/m·K and the thermal interface material comprises a thermal conductivity greater than or approximately equal to 50 W/m·K.

20. The semiconductor device of claim 18, wherein the top surface of the semiconductor die is separated from the internal surface of the package lid by a distance that is greater than or approximately equal to 100 microns.

* * * * *